(12) United States Patent
Moriwaki

(10) Patent No.: US 7,406,654 B2
(45) Date of Patent: Jul. 29, 2008

(54) CODING CIRCUIT FOR RECORDING DATA ON DVD DISK

(75) Inventor: Isamu Moriwaki, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 666 days.

(21) Appl. No.: 10/742,529

(22) Filed: Dec. 18, 2003

(65) Prior Publication Data

US 2004/0163031 A1 Aug. 19, 2004

(30) Foreign Application Priority Data

Dec. 25, 2002 (JP) ............................. 2002-374903

(51) Int. Cl.
G06F 11/00 (2006.01)
H03M 13/00 (2006.01)
(52) U.S. Cl. .................. 714/801; 714/755; 714/784; 714/788
(58) Field of Classification Search ................ 714/801, 714/757, 701, 755, 771
See application file for complete search history.

(56) References Cited

U.S. PATENT DOCUMENTS

| | | | |
|---|---|---|---|
| 5,088,078 A | 2/1992 | Moriwaki et al. | |
| 5,463,505 A * | 10/1995 | Kaniwa et al. | 360/73.04 |
| 5,546,409 A * | 8/1996 | Karasawa | 714/755 |
| 5,699,368 A | 12/1997 | Sakai et al. | |
| 5,889,794 A * | 3/1999 | Mo et al. | 714/784 |
| 5,930,453 A * | 7/1999 | Shimizu et al. | 386/131 |
| 6,205,568 B1 | 3/2001 | Kodama | |
| 6,216,201 B1 | 4/2001 | Ado et al. | |
| 6,332,206 B1 * | 12/2001 | Nakatsuji et al. | 714/755 |
| 6,470,473 B1 | 10/2002 | Iwasa | |
| 6,505,319 B1 | 1/2003 | Kodama | |
| 6,594,215 B2 | 7/2003 | Moriwaki | |
| 6,680,176 B2 * | 1/2004 | Matzinger et al. | 435/7.24 |
| 6,802,040 B1 * | 10/2004 | Ohyama et al. | 714/781 |
| 2001/0023497 A1 | 9/2001 | Seki | |

FOREIGN PATENT DOCUMENTS

| | | |
|---|---|---|
| JP | 7-312560 | 11/1995 |
| JP | 61-110398 | 5/1996 |
| JP | 10-229344 | 8/1998 |
| JP | 2000-165259 | 6/2000 |
| JP | 2000-251418 | 9/2000 |
| JP | 2000-331439 | 11/2000 |
| JP | 2001-156649 | 6/2001 |
| JP | 2001-244821 | 9/2001 |
| JP | 2001-319431 | 11/2001 |
| JP | 2002-319248 | 10/2002 |

* cited by examiner

*Primary Examiner*—Guy J. Lamarre
(74) *Attorney, Agent, or Firm*—Cooper & Dunham, LLP

(57) ABSTRACT

A coding circuit for generating an error correction code from digital data to be recorded in a record medium, includes a buffer manager which successively reads the digital data m bytes at a time from a temporal storage memory in a main scan direction and in a sub-scan direction, a PI parity unit which processes the data m bytes at a time, as the m bytes are supplied from the buffer manager, and generates a PI sequence parity based on the data for one row extending in the main scan direction, and a PO parity unit which includes in operation units, each of which processes a corresponding byte of the data, as m bytes of the digital data are supplied from the buffer manager, and generates a PO sequence parity based on the data for one column extending in the sub-scan direction.

4 Claims, 24 Drawing Sheets

FIG.5

| i | α[i] | i | α[i] | i | α[i] | i | α[i] |
|---|---|---|---|---|---|---|---|
| 0 | 01 | 64 | 5F | 128 | 85 | 192 | 82 |
| 1 | 02 | 65 | BE | 129 | 17 | 193 | 19 |
| 2 | 04 | 66 | 61 | 130 | 2E | 194 | 32 |
| 3 | 08 | 67 | C2 | 131 | 5C | 195 | 64 |
| 4 | 10 | 68 | 99 | 132 | B8 | 196 | C8 |
| 5 | 20 | 69 | 2F | 133 | 6D | 197 | 8D |
| 6 | 40 | 70 | 5E | 134 | DA | 198 | 07 |
| 7 | 80 | 71 | BC | 135 | A9 | 199 | 0E |
| 8 | 1D | 72 | 65 | 136 | 4F | 200 | 1C |
| 9 | 3A | 73 | CA | 137 | 9E | 201 | 38 |
| 10 | 74 | 74 | 89 | 138 | 21 | 202 | 70 |
| 11 | E8 | 75 | 0F | 139 | 42 | 203 | E0 |
| 12 | CD | 76 | 1E | 140 | 84 | 204 | DD |
| 13 | 87 | 77 | 3C | 141 | 15 | 205 | A7 |
| 14 | 13 | 78 | 78 | 142 | 2A | 206 | 53 |
| 15 | 26 | 79 | F0 | 143 | 54 | 207 | A6 |
| 16 | 4C | 80 | FD | 144 | A8 | 208 | 51 |
| 17 | 98 | 81 | E7 | 145 | 4D | 209 | A2 |
| 18 | 2D | 82 | D3 | 146 | 9A | 210 | 59 |
| 19 | 5A | 83 | BB | 147 | 29 | 211 | B2 |
| 20 | B4 | 84 | 6B | 148 | 52 | 212 | 79 |
| 21 | 75 | 85 | D6 | 149 | A4 | 213 | F2 |
| 22 | EA | 86 | B1 | 150 | 55 | 214 | F9 |
| 23 | C9 | 87 | 7F | 151 | AA | 215 | EF |
| 24 | 8F | 88 | FE | 152 | 49 | 216 | C3 |
| 25 | 03 | 89 | E1 | 153 | 92 | 217 | 9B |
| 26 | 06 | 90 | DF | 154 | 39 | 218 | 2B |
| 27 | 0C | 91 | A3 | 155 | 72 | 219 | 56 |
| 28 | 18 | 92 | 5B | 156 | E4 | 220 | AC |
| 29 | 30 | 93 | B6 | 157 | D5 | 221 | 45 |
| 30 | 60 | 94 | 71 | 158 | 87 | 222 | 8A |
| 31 | C0 | 95 | E2 | 159 | 73 | 223 | 09 |
| 32 | 9D | 96 | D9 | 160 | E6 | 224 | 12 |
| 33 | 27 | 97 | AF | 161 | D1 | 225 | 24 |
| 34 | 4E | 98 | 43 | 162 | BF | 226 | 48 |
| 35 | 9C | 99 | 86 | 163 | 63 | 227 | 90 |
| 36 | 25 | 100 | 11 | 164 | C6 | 228 | 3D |
| 37 | 4A | 101 | 22 | 165 | 91 | 229 | 7A |
| 38 | 94 | 102 | 44 | 166 | 3F | 230 | F4 |
| 39 | 35 | 103 | 88 | 167 | 7E | 231 | F5 |
| 40 | 6A | 104 | 0D | 168 | FC | 232 | F7 |
| 41 | D4 | 105 | 1A | 169 | E5 | 233 | F3 |
| 42 | B5 | 106 | 34 | 170 | D7 | 234 | FB |
| 43 | 77 | 107 | 68 | 171 | B3 | 235 | EB |
| 44 | EE | 108 | D0 | 172 | 7B | 236 | CB |
| 45 | C1 | 109 | BD | 173 | F6 | 237 | 8B |
| 46 | 9F | 110 | 67 | 174 | F1 | 238 | 0B |
| 47 | 23 | 111 | CE | 175 | FF | 239 | 16 |
| 48 | 46 | 112 | 81 | 176 | E3 | 240 | 2C |
| 49 | 8C | 113 | 1F | 177 | DB | 241 | 58 |
| 50 | 05 | 114 | 3E | 178 | AB | 242 | B0 |
| 51 | 0A | 115 | 7C | 179 | 4B | 243 | 7D |
| 52 | 14 | 116 | F8 | 180 | 96 | 244 | FA |
| 53 | 28 | 117 | ED | 181 | 31 | 245 | E9 |
| 54 | 50 | 118 | C7 | 182 | 62 | 246 | CF |
| 55 | A0 | 119 | 93 | 183 | C4 | 247 | 83 |
| 56 | 5D | 120 | 3B | 184 | 95 | 248 | 1B |
| 57 | BA | 121 | 76 | 185 | 37 | 249 | 36 |
| 58 | 69 | 122 | EC | 186 | 6E | 250 | 6C |
| 59 | D2 | 123 | C5 | 187 | DC | 251 | D8 |
| 60 | B9 | 124 | 97 | 188 | A5 | 252 | AD |
| 61 | 6F | 125 | 33 | 189 | 57 | 253 | 47 |
| 62 | DE | 126 | 66 | 190 | AE | 254 | 8E |
| 63 | A1 | 127 | CC | 191 | 41 | 255 | 00 |

FIG.6

| i | log α[i] | i | log α[i] | i | log α[i] | i | log α[i] |
|---|---|---|---|---|---|---|---|
| 0 | 255 | 64 | 6 | 128 | 7 | 192 | 31 |
| 1 | 0 | 65 | 191 | 129 | 112 | 193 | 45 |
| 2 | 1 | 66 | 139 | 130 | 192 | 194 | 67 |
| 3 | 25 | 67 | 98 | 131 | 247 | 195 | 216 |
| 4 | 2 | 68 | 102 | 132 | 140 | 196 | 183 |
| 5 | 50 | 69 | 221 | 133 | 128 | 197 | 123 |
| 6 | 26 | 70 | 48 | 134 | 99 | 198 | 164 |
| 7 | 198 | 71 | 253 | 135 | 13 | 199 | 118 |
| 8 | 3 | 72 | 226 | 136 | 103 | 200 | 196 |
| 9 | 223 | 73 | 152 | 137 | 74 | 201 | 23 |
| 10 | 51 | 74 | 37 | 138 | 222 | 202 | 73 |
| 11 | 238 | 75 | 179 | 139 | 237 | 203 | 236 |
| 12 | 27 | 76 | 16 | 140 | 49 | 204 | 127 |
| 13 | 104 | 77 | 145 | 141 | 197 | 205 | 12 |
| 14 | 199 | 78 | 34 | 142 | 254 | 206 | 111 |
| 15 | 75 | 79 | 136 | 143 | 24 | 207 | 246 |
| 16 | 4 | 80 | 54 | 144 | 227 | 208 | 108 |
| 17 | 100 | 81 | 208 | 145 | 165 | 209 | 161 |
| 18 | 224 | 82 | 148 | 146 | 153 | 210 | 59 |
| 19 | 14 | 83 | 206 | 147 | 119 | 211 | 82 |
| 20 | 52 | 84 | 143 | 148 | 38 | 212 | 41 |
| 21 | 141 | 85 | 150 | 149 | 184 | 213 | 157 |
| 22 | 239 | 86 | 219 | 150 | 180 | 214 | 85 |
| 23 | 129 | 87 | 189 | 151 | 124 | 215 | 170 |
| 24 | 28 | 88 | 241 | 152 | 17 | 216 | 251 |
| 25 | 193 | 89 | 210 | 153 | 68 | 217 | 96 |
| 26 | 105 | 90 | 19 | 154 | 146 | 218 | 134 |
| 27 | 248 | 91 | 92 | 155 | 217 | 219 | 177 |
| 28 | 200 | 92 | 131 | 156 | 35 | 220 | 187 |
| 29 | 8 | 93 | 56 | 157 | 32 | 221 | 204 |
| 30 | 76 | 94 | 70 | 158 | 137 | 222 | 62 |
| 31 | 113 | 95 | 64 | 159 | 46 | 223 | 90 |
| 32 | 5 | 96 | 30 | 160 | 55 | 224 | 203 |
| 33 | 138 | 97 | 66 | 161 | 63 | 225 | 89 |
| 34 | 101 | 98 | 182 | 162 | 209 | 226 | 95 |
| 35 | 47 | 99 | 163 | 163 | 91 | 227 | 176 |
| 36 | 225 | 100 | 195 | 164 | 149 | 228 | 156 |
| 37 | 36 | 101 | 72 | 165 | 188 | 229 | 169 |
| 38 | 15 | 102 | 126 | 166 | 207 | 230 | 160 |
| 39 | 33 | 103 | 110 | 167 | 205 | 231 | 81 |
| 40 | 53 | 104 | 107 | 168 | 144 | 232 | 11 |
| 41 | 147 | 105 | 58 | 169 | 135 | 233 | 245 |
| 42 | 142 | 106 | 40 | 170 | 151 | 234 | 22 |
| 43 | 218 | 107 | 84 | 171 | 178 | 235 | 235 |
| 44 | 240 | 108 | 250 | 172 | 220 | 236 | 122 |
| 45 | 18 | 109 | 133 | 173 | 252 | 237 | 117 |
| 46 | 130 | 110 | 186 | 174 | 190 | 238 | 44 |
| 47 | 69 | 111 | 61 | 175 | 97 | 239 | 215 |
| 48 | 29 | 112 | 202 | 176 | 242 | 240 | 79 |
| 49 | 181 | 113 | 94 | 177 | 86 | 241 | 174 |
| 50 | 194 | 114 | 155 | 178 | 211 | 242 | 213 |
| 51 | 125 | 115 | 159 | 179 | 171 | 243 | 233 |
| 52 | 106 | 116 | 10 | 180 | 20 | 244 | 230 |
| 53 | 39 | 117 | 21 | 181 | 42 | 245 | 231 |
| 54 | 249 | 118 | 121 | 182 | 93 | 246 | 173 |
| 55 | 185 | 119 | 43 | 183 | 158 | 247 | 232 |
| 56 | 201 | 120 | 78 | 184 | 132 | 248 | 116 |
| 57 | 154 | 121 | 212 | 185 | 60 | 249 | 214 |
| 58 | 9 | 122 | 229 | 186 | 57 | 250 | 244 |
| 59 | 120 | 123 | 172 | 187 | 83 | 251 | 234 |
| 60 | 77 | 124 | 115 | 188 | 71 | 252 | 168 |
| 61 | 228 | 125 | 243 | 189 | 109 | 253 | 80 |
| 62 | 114 | 126 | 167 | 190 | 65 | 254 | 88 |
| 63 | 166 | 127 | 87 | 191 | 162 | 255 | 175 |

FIG.7

```
mulgf[0] = (AI[0]&BI[0])^(AI[1]&BI[7])^(AI[2]&BI[6])^
           (AI[3]&BI[5])^(AI[4]&BI[4])^(AI[5]&BI[3])^
           (AI[5]&BI[7])^(AI[6]&BI[2])^(AI[6]&BI[6])^
           (AI[6]&BI[7])^(AI[7]&BI[1])^(AI[7]&BI[5])^
           (AI[7]&BI[6])^(AI[7]&BI[7]);

mulgf[1] = (AI[0]&BI[1])^(AI[1]&BI[0])^(AI[2]&BI[7])^
           (AI[3]&BI[6])^(AI[4]&BI[5])^(AI[5]&BI[4])^
           (AI[6]&BI[3])^(AI[6]&BI[7])^(AI[7]&BI[2])^
           (AI[7]&BI[6])^(AI[7]&BI[7]);

mulgf[2] = (AI[0]&BI[2])^(AI[1]&BI[1])^(AI[1]&BI[7])^
           (AI[2]&BI[0])^(AI[2]&BI[6])^(AI[3]&BI[5])^
           (AI[3]&BI[7])^(AI[4]&BI[4])^(AI[4]&BI[6])^
           (AI[5]&BI[3])^(AI[5]&BI[5])^(AI[5]&BI[7])^
           (AI[6]&BI[2])^(AI[6]&BI[4])^(AI[6]&BI[6])^
           (AI[6]&BI[7])^(AI[7]&BI[1])^(AI[7]&BI[3])^
           (AI[7]&BI[5])^(AI[7]&BI[6]);

mulgf[3] = (AI[0]&BI[3])^(AI[1]&BI[2])^(AI[1]&BI[7])^
           (AI[2]&BI[1])^(AI[2]&BI[6])^(AI[2]&BI[7])^
           (AI[3]&BI[0])^(AI[3]&BI[5])^(AI[3]&BI[6])^
           (AI[4]&BI[4])^(AI[4]&BI[5])^(AI[4]&BI[7])^
           (AI[5]&BI[3])^(AI[5]&BI[4])^(AI[5]&BI[6])^
           (AI[5]&BI[7])^(AI[6]&BI[2])^(AI[6]&BI[3])^
           (AI[6]&BI[5])^(AI[6]&BI[6])^(AI[7]&BI[1])^
           (AI[7]&BI[2])^(AI[7]&BI[4])^(AI[7]&BI[5]);

mulgf[4] = (AI[0]&BI[4])^(AI[1]&BI[3])^(AI[1]&BI[7])^
           (AI[2]&BI[2])^(AI[2]&BI[6])^(AI[2]&BI[7])^
           (AI[3]&BI[1])^(AI[3]&BI[5])^(AI[3]&BI[6])^
           (AI[3]&BI[7])^(AI[4]&BI[0])^(AI[4]&BI[4])^
           (AI[4]&BI[5])^(AI[4]&BI[6])^(AI[5]&BI[3])^
           (AI[5]&BI[4])^(AI[5]&BI[5])^(AI[6]&BI[2])^
           (AI[6]&BI[3])^(AI[6]&BI[4])^(AI[7]&BI[1])^
           (AI[7]&BI[2])^(AI[7]&BI[3])^(AI[7]&BI[7]);

mulgf[5] = (AI[0]&BI[5])^(AI[1]&BI[4])^(AI[2]&BI[3])^
           (AI[2]&BI[7])^(AI[3]&BI[2])^(AI[3]&BI[6])^
           (AI[3]&BI[7])^(AI[4]&BI[1])^(AI[4]&BI[5])^
           (AI[4]&BI[6])^(AI[4]&BI[7])^(AI[5]&BI[0])^
           (AI[5]&BI[4])^(AI[5]&BI[5])^(AI[5]&BI[6])^
           (AI[6]&BI[3])^(AI[6]&BI[4])^(AI[6]&BI[5])^
           (AI[7]&BI[2])^(AI[7]&BI[3])^(AI[7]&BI[4]);

mulgf[6] = (AI[0]&BI[6])^(AI[1]&BI[5])^(AI[2]&BI[4])^
           (AI[3]&BI[3])^(AI[3]&BI[7])^(AI[4]&BI[2])^
           (AI[4]&BI[6])^(AI[4]&BI[7])^(AI[5]&BI[1])^
           (AI[5]&BI[5])^(AI[5]&BI[6])^(AI[5]&BI[7])^
           (AI[6]&BI[0])^(AI[6]&BI[4])^(AI[6]&BI[5])^
           (AI[6]&BI[6])^(AI[7]&BI[3])^(AI[7]&BI[4])^
           (AI[7]&BI[5]);

mulgf[7] = (AI[0]&BI[7])^(AI[1]&BI[6])^(AI[2]&BI[5])^
           (AI[3]&BI[4])^(AI[4]&BI[3])^(AI[4]&BI[7])^
           (AI[5]&BI[2])^(AI[5]&BI[6])^(AI[5]&BI[7])^
           (AI[6]&BI[1])^(AI[6]&BI[5])^(AI[6]&BI[6])^
           (AI[6]&BI[7])^(AI[7]&BI[0])^(AI[7]&BI[4])^
           (AI[7]&BI[5])^(AI[7]&BI[6]);
```

FIG.9

```
next_EDC[31] = T[31]^T[30]      ^T[28]      ^T[26]^T[25]^T[24]
                ^T[23]^T[22]^T[21]^T[20]^T[19]^T[18]^T[17]^T[16]
                ^T[15]^T[14]^T[13]^T[12]^T[11]^T[10]^T[ 9]^T[ 8]
                ^T[ 7]^T[ 6]^T[ 5]^T[ 4]^T[ 3]^T[ 2]^T[ 1]^T[ 0] ;
next_EDC[30] = T[29]^T[28]^T[27]^T[26] ;
next_EDC[29] = T[28]^T[27]^T[26]^T[25] ;
next_EDC[28] = T[27]^T[26]^T[25]^T[24] ;
next_EDC[27] = T[26]^T[25]^T[24]^T[23] ;
next_EDC[26] = T[25]^T[24]^T[23]^T[22] ;
next_EDC[25] = T[24]^T[23]^T[22]^T[21] ;
next_EDC[24] = T[23]^T[22]^T[21]^T[20] ;
next_EDC[23] = T[22]^T[21]^T[20]^T[19] ;
next_EDC[22] = T[21]^T[20]^T[19]^T[18] ;
next_EDC[21] = T[20]^T[19]^T[18]^T[17] ;
next_EDC[20] = T[19]^T[18]^T[17]^T[16] ;
next_EDC[19] = T[18]^T[17]^T[16]^T[15] ;
next_EDC[18] = T[17]^T[16]^T[15]^T[14] ;
next_EDC[17] = T[16]^T[15]^T[14]^T[13] ;
next_EDC[16] = T[15]^T[14]^T[13]^T[12] ;
next_EDC[15] = T[14]^T[13]^T[12]^T[11] ;
next_EDC[14] = T[13]^T[12]^T[11]^T[10] ;
next_EDC[13] = T[12]^T[11]^T[10]^T[ 9] ;
next_EDC[12] = T[11]^T[10]^T[ 9]^T[ 8] ;
next_EDC[11] = T[10]^T[ 9]^T[ 8]^T[ 7] ;
next_EDC[10] = T[ 9]^T[ 8]^T[ 7]^T[ 6] ;
next_EDC[9]  = T[ 8]^T[ 7]^T[ 6]^T[ 5] ;
next_EDC[8]  = T[ 7]^T[ 6]^T[ 5]^T[ 4] ;
next_EDC[7]  = T[31]^T[ 6]^T[ 5]^T[ 4]^T[ 3] ;
next_EDC[6]  = T[30]^T[ 5]^T[ 4]^T[ 3]^T[ 2] ;
next_EDC[5]  = T[31]^T[29]^T[ 4]^T[ 3]^T[ 2]^T[ 1] ;
next_EDC[4]  = T[30]^T[28]^T[ 3]^T[ 2]^T[ 1]^T[ 0] ;
next_EDC[3]  = T[30]^T[29]^T[28]^T[27]^T[26]^T[25]^T[24]
                ^T[23]^T[22]^T[21]^T[20]^T[19]^T[18]^T[17]^T[16]
                ^T[15]^T[14]^T[13]^T[12]^T[11]^T[10]^T[ 9]^T[ 8]
                ^T[ 7]^T[ 6]^T[ 5]^T[ 4]^T[ 3] ;
next_EDC[2]  = T[31]^T[29]^T[28]^T[27]^T[26]^T[25]^T[24]
                ^T[23]^T[22]^T[21]^T[20]^T[19]^T[18]^T[17]^T[16]
                ^T[15]^T[14]^T[13]^T[12]^T[11]^T[10]^T[ 9]^T[ 8]
                ^T[ 7]^T[ 6]^T[ 5]^T[ 4]^T[ 3]^T[ 2] ;
next_EDC[1]  = T[30]^T[28]^T[27]^T[26]^T[25]^T[24]
                ^T[23]^T[22]^T[21]^T[20]^T[19]^T[18]^T[17]^T[16]
                ^T[15]^T[14]^T[13]^T[12]^T[11]^T[10]^T[ 9]^T[ 8]
                ^T[ 7]^T[ 6]^T[ 5]^T[ 4]^T[ 3]^T[ 2]^T[ 1] ;
next_EDC[0]  = T[31]^T[29]^T[27]^T[26]^T[25]^T[24]
                ^T[23]^T[22]^T[21]^T[20]^T[19]^T[18]^T[17]^T[16]
                ^T[15]^T[14]^T[13]^T[12]^T[11]^T[10]^T[ 9]^T[ 8]
                ^T[ 7]^T[ 6]^T[ 5]^T[ 4]^T[ 3]^T[ 2]^T[ 1]^T[ 0] ;
```

FIG.12

```
nextSCR[31] = SCR[14] ^ SCR[10];
nextSCR[30] = SCR[13] ^ SCR[9];
nextSCR[29] = SCR[12] ^ SCR[8];
nextSCR[28] = SCR[11] ^ SCR[7];
nextSCR[27] = SCR[10] ^ SCR[6];
nextSCR[26] = SCR[9] ^ SCR[5];
nextSCR[25] = SCR[8] ^ SCR[4];
nextSCR[24] = SCR[7] ^ SCR[3];
nextSCR[23] = SCR[6] ^ SCR[2];
nextSCR[22] = SCR[5] ^ SCR[1];
nextSCR[21] = SCR[4] ^ SCR[0];
nextSCR[20] = SCR[3] ^ SCR[14] ^ SCR[10];
nextSCR[19] = SCR[2] ^ SCR[13] ^ SCR[9];
nextSCR[18] = SCR[1] ^ SCR[12] ^ SCR[8];
nextSCR[17] = SCR[0] ^ SCR[11] ^ SCR[7];
nextSCR[16] = SCR[14] ^ SCR[6];
nextSCR[15] = SCR[13] ^ SCR[5];
nextSCR[14] = SCR[12] ^ SCR[4];
nextSCR[13] = SCR[11] ^ SCR[3];
nextSCR[12] = SCR[10] ^ SCR[2];
nextSCR[11] = SCR[9] ^ SCR[1];
nextSCR[10] = SCR[8] ^ SCR[0];
nextSCR[ 9] = SCR[7] ^ SCR[14] ^ SCR[10];
nextSCR[ 8] = SCR[6] ^ SCR[13] ^ SCR[9];
nextSCR[ 7] = SCR[5] ^ SCR[12] ^ SCR[8];
nextSCR[ 6] = SCR[4] ^ SCR[11] ^ SCR[7];
nextSCR[ 5] = SCR[3] ^ SCR[10] ^ SCR[6];
nextSCR[ 4] = SCR[2] ^ SCR[9] ^ SCR[5];
nextSCR[ 3] = SCR[1] ^ SCR[8] ^ SCR[4];
nextSCR[ 2] = SCR[0] ^ SCR[7] ^ SCR[3];
nextSCR[ 1] = SCR[14] ^ SCR[10] ^ SCR[6] ^ SCR[2];
nextSCR[ 0] = SCR[13] ^ SCR[9] ^ SCR[5] ^ SCR[1];
```

FIG.14 next_PIP[79:72] = PIP[47:40] ^
  mulgf( 8'h71, T0) ^ mulgf( 8'he2, T1) ^ mulgf( 8'h41, T2) ^ mulgf( 8'hd8, T3);

next_PIP[71:64] = PIP[39:32] ^
  mulgf( 8'h49, T0) ^ mulgf( 8'hd2, T1) ^ mulgf( 8'h3e, T2) ^ mulgf( 8'hc2, T3);

next_PIP[63:56] = PIP[31:24] ^
  mulgf( 8'hd8, T0) ^ mulgf( 8'hf6, T1) ^ mulgf( 8'hda, T2) ^ mulgf( 8'h9f, T3);

next_PIP[55:48] = PIP[23:16] ^
  mulgf( 8'h8a, T0) ^ mulgf( 8'hcd, T1) ^ mulgf( 8'h7d, T2) ^ mulgf( 8'h6f, T3);

next_PIP[47:40] = PIP[15: 8] ^
  mulgf( 8'h7a, T0) ^ mulgf( 8'h6e, T1) ^ mulgf( 8'h60, T2) ^ mulgf( 8'hc7, T3);

next_PIP[39:32] = PIP[ 7: 0] ^
  mulgf( 8'hd2, T0) ^ mulgf( 8'h88, T1) ^ mulgf( 8'h3e, T2) ^ mulgf( 8'h5e, T3);

next_PIP[31:24] =
  mulgf( 8'hca, T0) ^ mulgf( 8'h43, T1) ^ mulgf( 8'hc8, T2) ^ mulgf( 8'h6f, T3);

next_PIP[23:16] =
  mulgf( 8'h8a, T0) ^ mulgf( 8'hb9, T1) ^ mulgf( 8'h42, T2) ^ mulgf( 8'h71, T3);

next_PIP[15: 8] =
  mulgf( 8'h07, T0) ^ mulgf( 8'hdd, T1) ^ mulgf( 8'hd9, T2) ^ mulgf( 8'h9d, T3);

next_PIP[ 7: 0] =
  mulgf( 8'h84, T0) ^ mulgf( 8'hcb, T1) ^ mulgf( 8'hd4, T2) ^ mulgf( 8'hc1, T3);

FIG.16

```
next_POP[127:120] = POP[119:112] ^ mulgf( 8'h3b, T0);
next_POP[119:112] = POP[111:104] ^ mulgf( 8'h0d, T0);
next_POP[111:104] = POP[103: 96] ^ mulgf( 8'h68, T0);
next_POP[103: 96] = POP[ 95: 88] ^ mulgf( 8'hbd, T0);
next_POP[ 95: 88] = POP[ 87: 80] ^ mulgf( 8'h44, T0);
next_POP[ 87: 80] = POP[ 79: 72] ^ mulgf( 8'hd1, T0);
next_POP[ 79: 72] = POP[ 71: 64] ^ mulgf( 8'h1e, T0);
next_POP[ 71: 64] = POP[ 63: 56] ^ mulgf( 8'h08, T0);
next_POP[ 63: 56] = POP[ 55: 48] ^ mulgf( 8'ha3, T0);
next_POP[ 55: 48] = POP[ 47: 40] ^ mulgf( 8'h41, T0);
next_POP[ 47: 40] = POP[ 39: 32] ^ mulgf( 8'h29, T0);
next_POP[ 39: 32] = POP[ 31: 24] ^ mulgf( 8'he5, T0);
next_POP[ 31: 24] = POP[ 23: 16] ^ mulgf( 8'h62, T0);
next_POP[ 23: 16] = POP[ 15:  8] ^ mulgf( 8'h32, T0);
next_POP[ 15:  8] = POP[  7:  0] ^ mulgf( 8'h24, T0);
next_POP[  7:  0] =                mulgf( 8'h3b, T0);
```

| | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 40 | PO(64) | PO(65) | PO(66) | PO(67) | PO(68) | PO(69) | PO(70) | PO(71) | PO(72) | PO(73) | PO(74) | PO(75) | PO(76) | PO(77) | PO(78) | PO(79) |
| 50 | PO(80) | PO(81) | PO(82) | PO(83) | PO(84) | PO(85) | PO(86) | PO(87) | PO(88) | PO(89) | PO(90) | PO(91) | PO(92) | PO(93) | PO(94) | PO(95) |
| 60 | PO(96) | PO(97) | PO(98) | PO(99) | PO(100) | PO(101) | PO(102) | PO(103) | PO(104) | PO(105) | PO(106) | PO(107) | PO(108) | PO(109) | PO(110) | PO(111) |
| 70 | PO(112) | PO(113) | PO(114) | PO(115) | PO(116) | PO(117) | PO(118) | PO(119) | PO(120) | PO(121) | PO(122) | PO(123) | PO(124) | PO(125) | PO(126) | PO(127) |

| | |
|---|---|
| 64–73 | SECOND SECTOR PO(64)–PO(127) |
| 74–7F | THIRD SECTOR PO(64)–PO(127) |
| 80 | 4-TH SECTOR PO(64)–PO(127) |
| | 5-TH SECTOR PO(64)–PO(127) |
| | 6-TH SECTOR PO(64)–PO(127) |
| | 7-TH SECTOR PO(64)–PO(127) |
| | 8-TH SECTOR PO(64)–PO(127) |
| | 9-TH SECTOR PO(64)–PO(127) |
| | 10-TH SECTOR PO(64)–PO(127) |
| | 11-TH SECTOR PO(64)–PO(127) |
| | 12-TH SECTOR PO(64)–PO(127) |
| | 13-TH SECTOR PO(64)–PO(127) |
| | 14-TH SECTOR PO(64)–PO(127) |
| | 15-TH SECTOR PO(64)–PO(127) |
| 127 | 16-TH SECTOR PO(64)–PO(127) |

FIG.24

FIG.25

CODING CIRCUIT FOR RECORDING DATA ON DVD DISK

This disclosure claims priority under 35 U.S.C. § 119 of Japanese application No. 2002-374903, filed Dec. 25, 2002.

BACKGROUND OF THE INVENTION

1. Field of the Invention

The present invention generally relates to encode-data processors, and particularly relates to an encode-data processor used in an optical disk drive which records data on a DVD+RW-type optical disk.

2. Description of the Related Art

Conventional technologies relating to coding methods and coding circuits for use in the recording of DVD disks can be classified into two categories. One relates to the encoding of data by use of an ECC correction circuit that is used for decoding, as described in Patent Document 1. The other relates to the use of a coding circuit dedicated for the encoding purpose, as described in Patent Document 2.

The former has an advantage in that the same circuit as an ECC correction circuit for use in decoding can be utilized. Since such circuit is not optimized for data encoding purposes, difficulties are in abundance in the attainment of higher speed.

The latter can relatively easily attain higher speed because of the use of a coding circuit dedicated for encoding. It is not known, however, what circuit construction is suitable for such a coding circuit.

[Patent Document 1] Japanese Patent Application Publication No. 2001-319431

[Patent Document 2] Japanese Patent Application Publication No. 2001-156649

In recent years, there has been an increasing demand for higher recording speed with respect to DVD disks. Accordingly, there is a need for a coding circuit that is fast and efficient in recording data on a DVD disk.

SUMMARY OF THE INVENTION

It is a general object of the present invention to provide a coding circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a coding circuit particularly pointed out in the specification in such full, clear, concise, and exact terms as to enable a person having ordinary skill in the art to practice the invention.

To achieve these and other advantages in accordance with the purpose of the invention, the invention provides a coding circuit for generating an error correction code from digital data that is to be recorded in a record medium. The coding circuit includes a temporal storage memory which stores the digital data, a buffer manager which successively reads the digital data m bytes at a time from the temporal storage memory in a main scan direction and in a sub-scan direction, a PI parity unit which processes the digital data m bytes at a time as the m bytes are supplied from the buffer manager so as to generate a PI sequence parity based on the digital data for one row extending in the main scan direction, and a PO parity unit which includes m operation units, each of which processes a corresponding one byte of the digital data as in bytes of the digital data are supplied from the buffer manager so as to generate a PO sequence parity based on the digital data for one column extending in the sub-scan direction.

According to another aspect of the invention, a coding circuit for coding digital data that is to be recorded in a record medium includes a temporal storage memory which stores original data to be recorded, intermediate processing results, and final processing results, an IED unit which processes all m bytes of an ID at a time to generate an n-byte ID error detection code, an EDC unit which processes the original data m bytes at a time to generate a data error detection code, a scrambling unit which scrambles the original data m bytes at a time, a PI parity unit which processes the ID, the ID error detection code, the data error detection code, and the scrambled original data m bytes at a time to generate a PI parity, and a PO parity unit which includes m operation units, each of which processes the intermediate processing results one byte at a time to generate a PO parity, wherein the original data is read from the temporal storage memory in a main scan direction for attaching of the ID, for attaching of the ID error detection code, for attaching of the data error detection code, for scrambling, and for attaching of the PI parity, followed by storage in the temporal storage memory as the intermediate processing results, until an end of an ECC block is encountered, and wherein the intermediate processing results are read from the temporal storage memory in a sub-can direction for attaching of the PO parity, followed by storage in the temporal storage memory as the final processing results, until the end of the ECC block is encountered.

According to another aspect of the invention, m is four, and n is two.

According to another aspect of the invention, the coding circuit as described above further includes a FIFO which is situated in front of the temporal storage memory for arranging the intermediate processing results for storage in the temporal storage memory and for arranging the final processing results for storage in the temporal storage memory, the FIFO serving as a 16-stage shift register with a 4-byte register at each stage when storing the intermediate processing results, the PI parity being loaded 4 bytes at a time to a predetermined intermediate stage of the shift register, the PO parity being loaded 4 bytes at a time to the shift register.

According to another aspect of the invention, the coding circuit as described above further includes a first counter which is capable of switching between counting from 0 to 15, counting from 0 to 10, counting from 0 to 13, a second counter which counts from 0 to 5, and counts up in response to a carry from the first counter, a third counter which counts from 0 to 11, and counts up in response to a carry from the second counter, a fourth counter which counts from 0 to 15, and counts up in response to a carry from the third counter, wherein all output bits of the fourth counter, bit2 and bit1 of output bits of the second counter, all output bits of the third counter, and all output bits of the first counter are arranged in an order named for use as an address for the temporal storage memory, and bit0 of output bits of the second counter is used to indicate either "write" or "read" when data is read from and written in the temporal storage memory in the main scan direction, a fifth counter which is capable of switching between counting from 0 to 15 and counting from 0 to 11, a sixth counter which counts from 0 to 16, and counts up in response to a carry from the fifth counter, a seventh counter which is capable of switching between counting from 0 to 15 and counting from 0 to 13, and counts up in response to a carry from the sixth counter, and an eighth counter which counts from 0 to 2, and counts up in response to a carry from the seventh counter, wherein all output bits of the sixth counter, all output bits of the eighth counter, all output bits of the fifth counter, and all output bits of the seventh counter are arranged in an order named for use as an address for the temporal storage memory, and bit4 of output bits of the sixth counter is used to indicate either "write" or "read" when data is read from and written in the temporal storage memory in the sub-scan direction.

According to another aspect of the invention, the IED unit includes an n-byte register, and a logic circuit that completes a logic operation thereof with only a device delay.

According to another aspect of the invention, the EDC unit includes an m-byte register, and a logic circuit that completes a logic operation thereof with only a device delay.

According to another aspect of the invention, the scrambling unit includes an m-byte register, and a logic circuit that completes a logic operation thereof with only a device delay.

According to another aspect of the invention, the PI parity unit includes a 10-byte register, and a logic circuit that completes a logic operation thereof with only a device delay.

According to another aspect of the invention, the PO parity unit includes a 16-byte register, and a logic circuit that completes a logic operation thereof with only a device delay.

The speed of rewritable DVD drives has been increasing every year. In order to achieve such increase, a coding circuit capable of high speed processing is necessary. A coding circuit capable of high speed processing can be realized by use of a logic circuit that ideally completes its logic operation with only a device delay. In the case of coding of the DVD data format, however, a logic circuit becomes a large scale, making it not possible to realize such ideal speed. The coding circuit of the invention is directed to an optimal construction for parallel computation in order to encode data of the DVD data format. This coding circuit performs parallel computation. Accordingly, a high-speed coding circuit for an optical disk drive is provided at a low cost.

For example, the coding circuit of the invention may process data 4 bytes at a time through parallel computation. Such a coding circuit successfully achieves 4 times faster speed than a conventional coding circuit which processes data one byte at a time.

Even the coding circuit that processes data through parallel computation needs a memory that provides a temporal storage for computation results. A conventional DRAM may be used for this memory to save the cost. A conventional DRAM is accessed by inputting a RAS address and a CAS address. When the PO sequence parity is computed, access addresses are not continuous, thereby resulting in an increased time for data access and thus a drop in the processing speed of a coding process.

The coding circuit of the invention includes an address generating circuit comprised of the counters for generating an address for the temporal storage memory. With this circuit, data access remains on the same RAS address even when the PO sequence parity is computed. This makes it possible to use an accessing scheme that requires the inputting of only CAS addresses (typically referred to as a burst access), thereby avoiding the drawback of reduced processing speed.

Other objects and further features of the present invention will be apparent from the following detailed description when read in conjunction with the accompanying drawings.

BRIEF DESCRIPTION OF THE DRAWINGS

FIG. 5 is a diagram showing a table that provides the vector representation of relationship between i and $\alpha[I]$;

FIG. 6 is a diagram showing a table that provides the vector representation of relationship between i and log $\alpha[I]$;

FIG. 7 is a diagram showing a logic circuit of mulfg;

FIG. 9 is a diagram showing a logic circuit that achieves an EDC operation of FIG. 8;

FIG. 12 is a diagram showing a logic circuit that achieves a 4-byte scrambling data generating circuit of FIG. 11;

FIG. 14 is a diagram showing a logic circuit that achieves a 4-byte PI parity operation unit of FIG. 13;

FIG. 16 is a diagram showing a logic circuit that achieves a 1-byte PO parity operation unit of FIG. 15;

Figure 20:
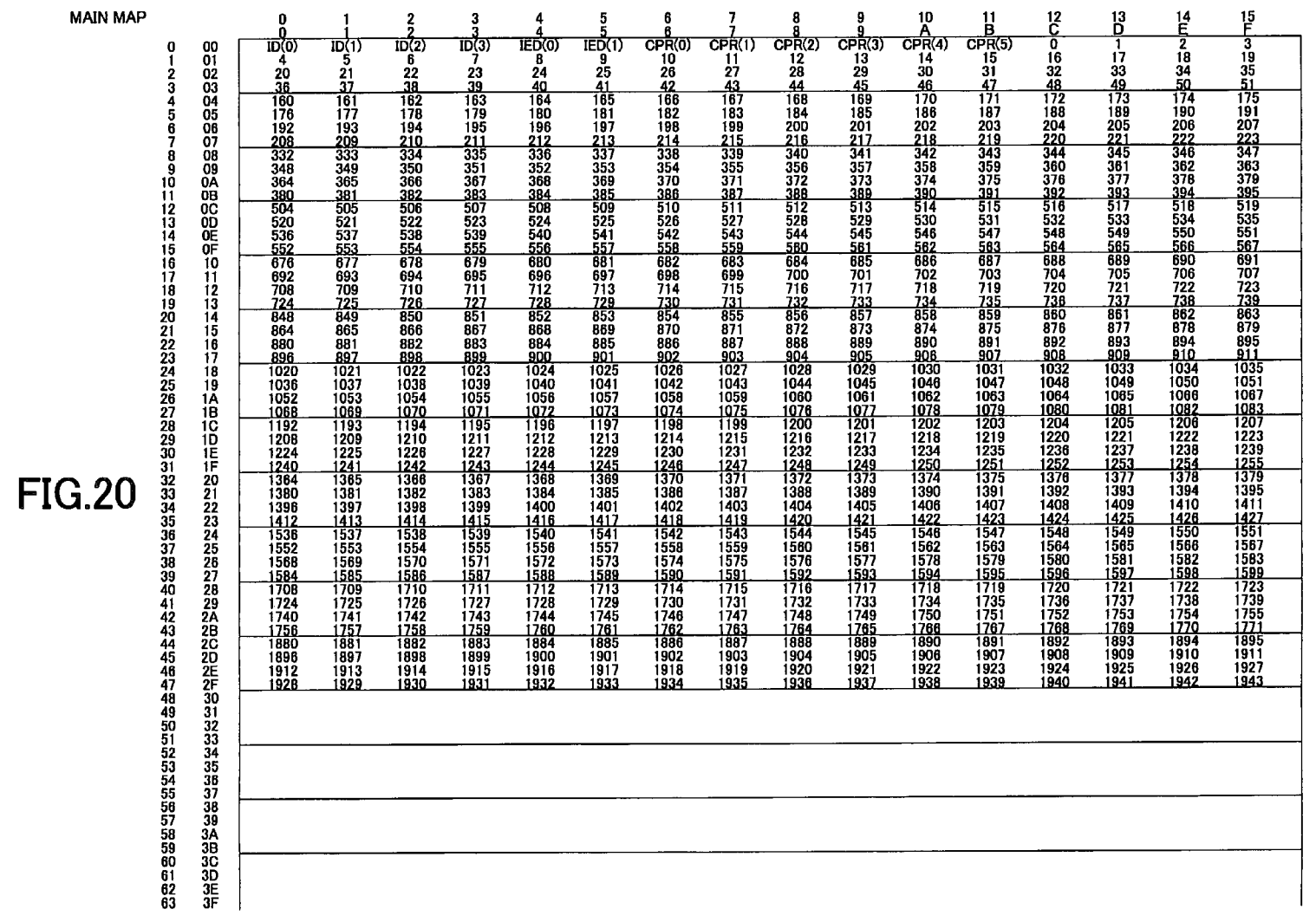

FIG. 20 is a diagram showing part of a data sector in the temporal storage memory;

Figure 21:
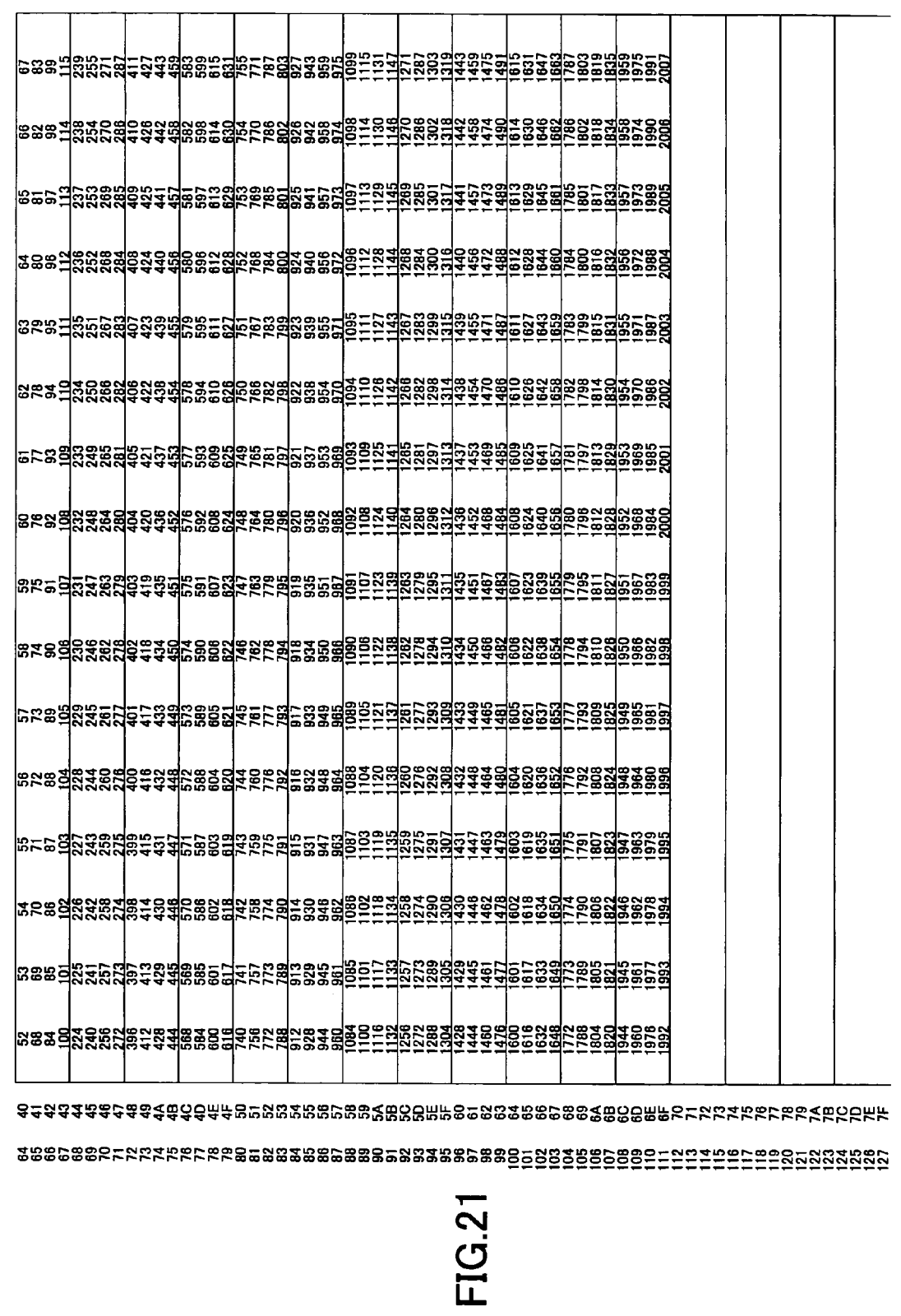

FIG. 21 is a diagram showing part of a data sector in the temporal storage memory;

Figure 22:
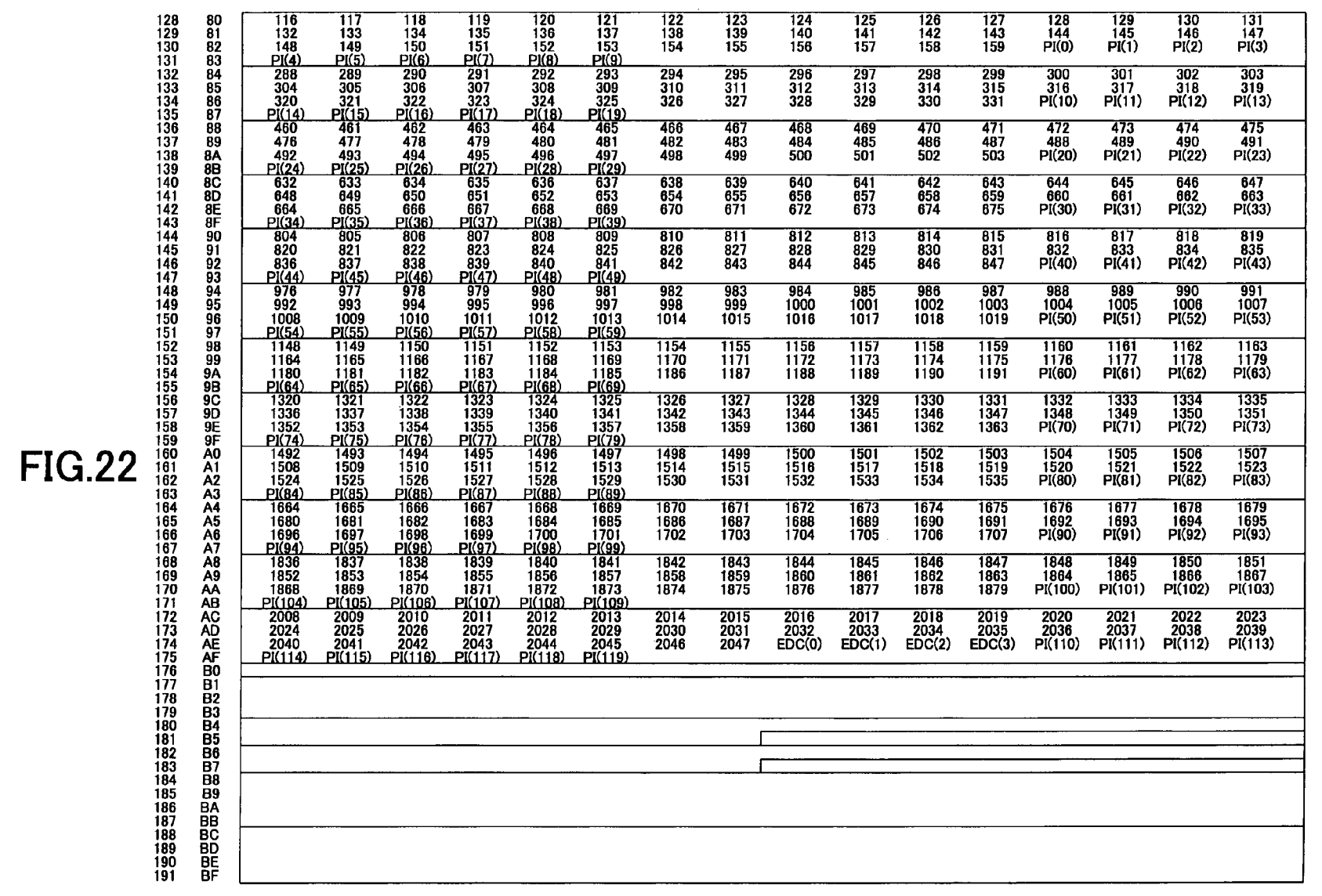

FIG. 22 is a diagram showing part of a data sector in the temporal storage memory;

FIG. 24 is a diagram showing part of a data sector in the temporal storage memory; and FIG. 25 is a diagram showing part of a data sector in the temporal storage memory.

DESCRIPTION OF THE PREFERRED EMBODIMENTS

In the following, embodiments of the present invention will be described with reference to the accompanying drawings.

Figure 1:
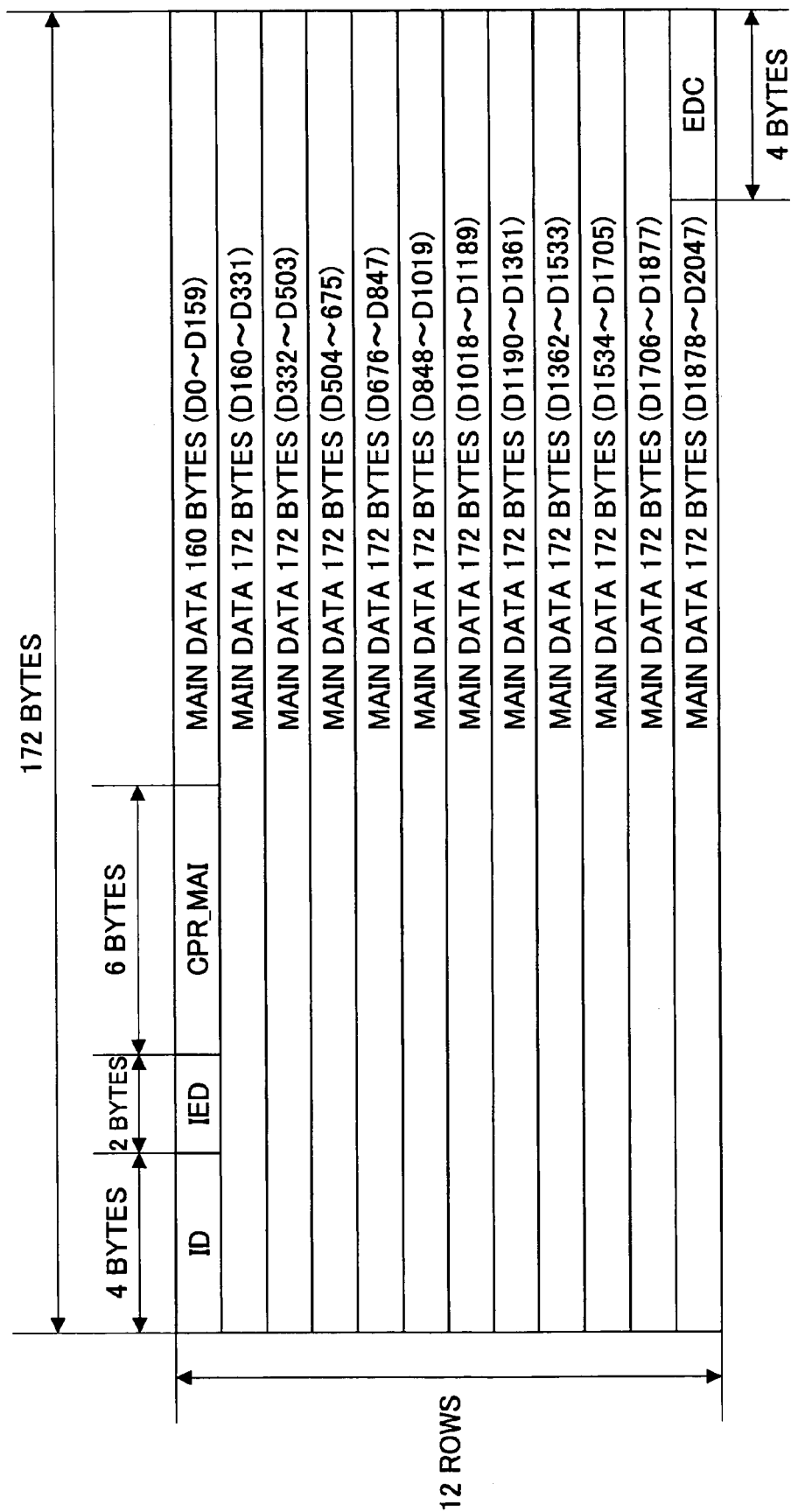
FIG. 1 is an illustrative drawing showing the format of data for one sector.

In the following, a description will be given of a data format used for DVD. Main data sent through a host computer interface is 2048 bytes per sector. As shown in FIG. 1, one sector data is comprised of 2064 bytes, including the main data, 4-byte ID, 2-byte IED, 6-byte CPR_MAI, and 4-byte EDC. ID (identification data) is comprised of 8-bit sector information and 24-bit address information. IED (ID error detection) is an error detection code for the ID. CPR_MAI (copyright management information) is comprised of 6 bytes, the detail of which will be omitted here. EDC (error detection code) is an error detection code with respect to data of one sector. The main data is subjected to scrambling.

The 2064-byte data per sector as described above are put together for 16 sectors, and a parity is added for the purpose of ECC (error correction). The parity is Reed-Solomon product codes, and is comprised of 10 bytes for the inner code sequence (PI sequence) and 16 bytes for the outer codes sequence (PO sequence).

Figure 2:
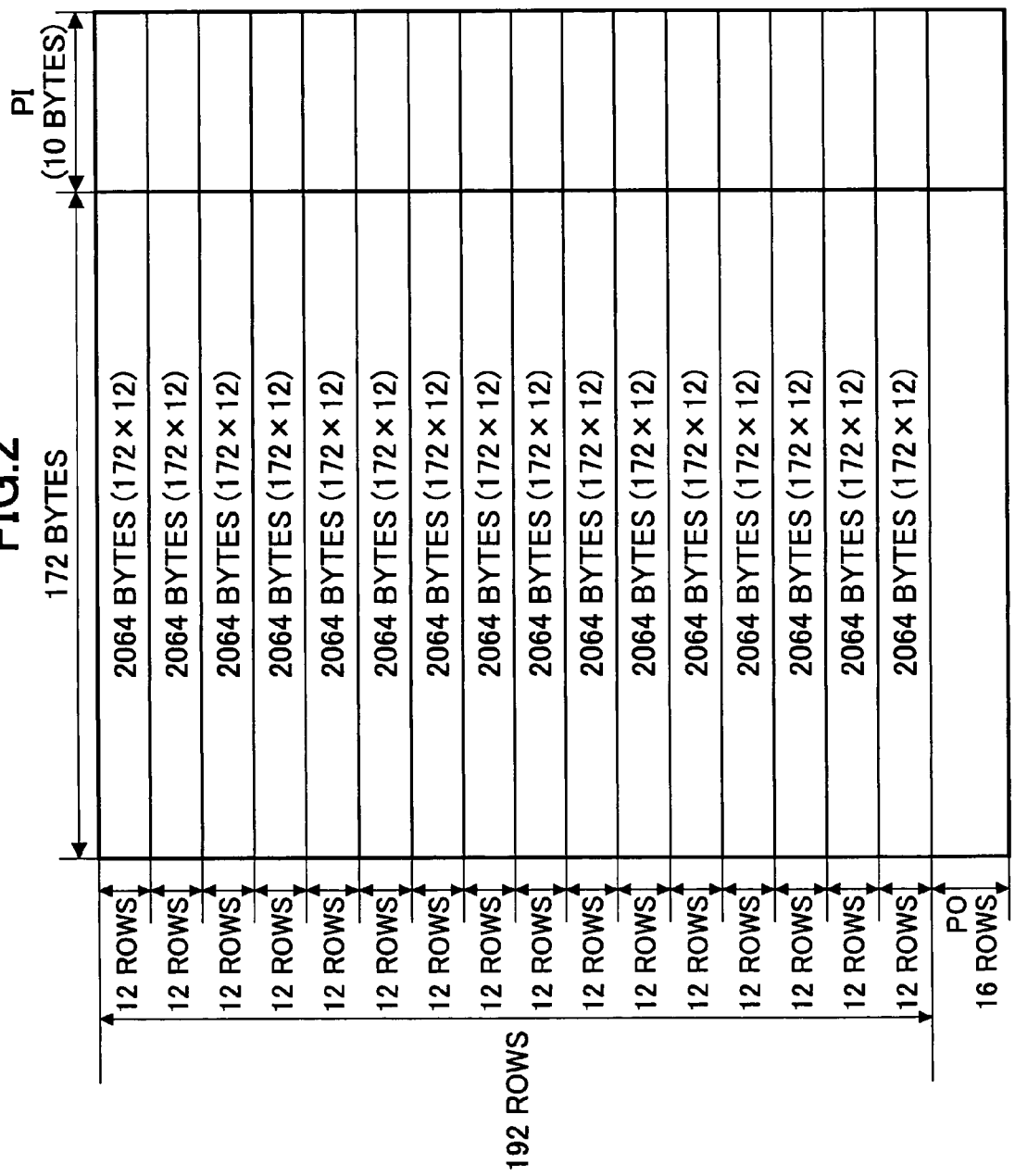
FIG. 2 is an illustrative drawing showing the format of an ECC block.

With reference to FIG. 2, 2064-byte data per sector is divided into 172 bytes×12 rows, and a 10-byte PI parity is attached to the 172-byte data. A total of 16 sectors make up 192 rows. A 16-byte PO parity is attached to 192 bytes extending in the column direction. Since data is processed on 16-sector-by-16-sector basis, this 16-sector block is referred to as an ECC block.

Figure 3:
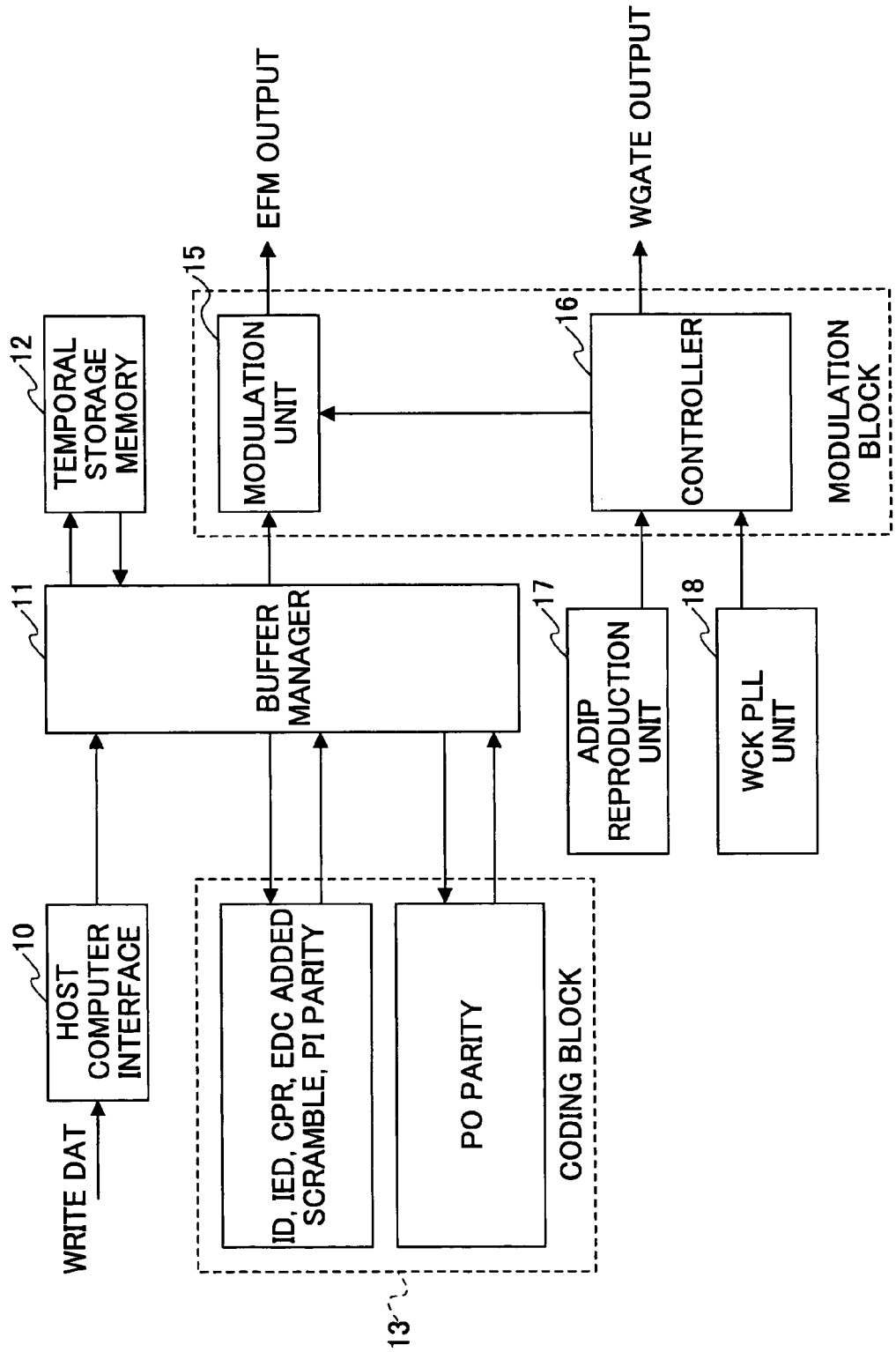
FIG. 3 is a block diagram showing an example of the construction of a coding circuit according to the invention.

In the following, a circuit construction according to the invention will be described. FIG. 3 is a block diagram showing an example of the construction of a coding circuit according to the invention. Main data supplied through a host computer interface 10 is arbitrated by a buffer manager 11 for storage in a temporal storage memory 12. A coding block 13 starts data encoding by reading the main data from the temporal storage memory 12 in the order of the PI sequence (i.e., in the main scan direction). ID, IED, CPR_MAI, EDC, and the PI parity are then attached to the retrieved data, followed by further storage in the temporal storage memory 12. After the PI sequence processing is completed for the 192 rows of one ECC block, the coding block 13 reads the data in the order of the PO sequence (i.e., in the sub-scan direction), followed by storage of the PO parity in the temporal storage memory 12. When the PO sequence processing is completed for the 182 columns of the ECC block, the encoding of data for one ECC block comes to an end. The encoded data is 8-16 modulated by a modulation unit 15 for writing of serial data in a disk at proper write timing. The modulation unit 15 is controlled by a controller 16, which attends to DVD encoding and start/stop control based on signals supplied from an ADIP reproduction unit 17 and a Wck PLL unit 18. The modulation unit 15 and the control unit 16 together make up a modulation block.

Figure 4:
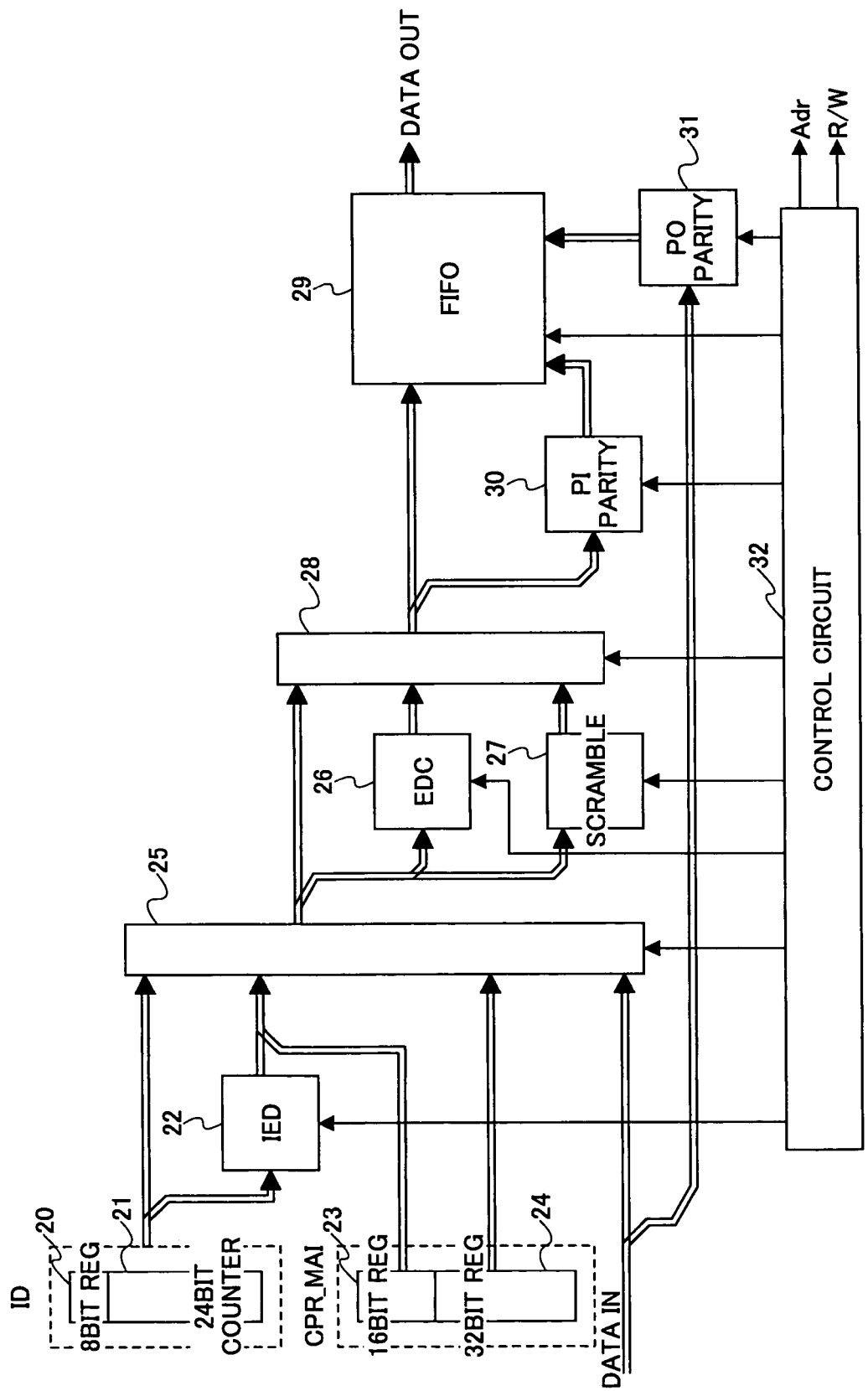
FIG. 4 is a block diagram showing an example of the construction of a coding circuit according to the invention.

FIG. 4 is a block diagram showing an example of the construction of a coding circuit according to the invention. The example of FIG. 4 shows a case in which a data bus connected to the buffer manager 11 is 4 bytes (32 bits). The temporal storage memory (not shown) is implemented by use of a DRAM such as an SDRAM (synchronous dynamic random access memory) or a DDR SDRAM (double data rate SDRAM). In general, a DRAM data bus has a 1-byte (8-bit) configuration or a 2-byte (16-bit) configuration. It is relatively easy to have an interface unit for an SDRAM that operates at double the system clock frequency, or to use a DDR SDRAM for accessing data with double the bus width of a DRAM.

A 8-bit register 20 for generating sector information and a 24-bit counter 21 for generating address information generates 4-byte ID. The 24-bit counter 21 allows presetting, and increments its count by increments of one sector.

An IED 22 is an arithmetic operation unit that receives the 4-type ID and generates a 2-byte error detection code.

A 16-bit register 23 and a 32-bit register 24 together generate 6-byte CPR_MAI.

A multiplexer 25 switches between the 4-byte ID, 4 bytes comprised of the 2-byte output of the IED 22 and 2 bytes of CPR_MAI, the 4 remaining bytes of CPR_MAI, and 4-byte data from the temporal storage memory 12.

An EDC 26 is an arithmetic operation unit that successively receives the 4-byte output of the multiplexer 25 and generates an error detection code upon the inputting of data for one sector.

A scrambling circuit 27 successively receives the main data portion of the 4-byte output of the multiplexer 25, and successively outputs 4-byte scrambled data.

A multiplexer 28 switches between the 4-byte output of the multiplexer 25, the 4-byte output of the EDC 26, and the 4-byte scrambled data supplied from the scrambling circuit 27. The output of the multiplexer 28 is supplied to a FIFO 29 4 bytes by 4 bytes.

A PI parity unit 30 is an arithmetic operation unit that successively receives the 4-byte output of the multiplexer 28 and generates a 10-byte PI sequence parity upon the inputting of data for one row (172 bytes). In this embodiment, all the 10 bytes of the PI sequence parity are supplied to the FIFO 29 at once.

A PO parity unit 31 is an arithmetic operation unit that successively receives data from the temporal storage memory 12 and generates a 16-byte PO sequence parity upon the inputting of data for one column (192 bytes). In this embodiment, the PO sequence processing is performed for four columns at once, and the PO sequence parity for four columns, i.e., a 64-byte PO sequence parity, is output.

The FIFO 29 may be a shift register that is comprised of 16 stages each for 4-byte storage, i.e., for storage of a total of 64 bytes, during the PI sequence processing. During the PO sequence processing, the 64 bytes of the PO sequence parity are output at once, so that the FIFO 29 may be a shift register that is capable of 64-byte parallel input.

A control circuit 32 supplies selection signals to each multiplexer, control signals to each arithmetic operation unit and the FIFO, and address signals as well as read/write signals to the temporal storage memory 12. Details will be described later.

In the following, the IED unit will be described. The 4 bytes of the input are denoted as C0, C1, C2, and C3, and the 2 bytes of the output are denoted as C4 and C5. Then, the IED operation is defined as follows.

$$IED(X) = \sum_{j=4}^{5} Cj \cdot X^{5-j} = \{(I(X) \cdot X^2) \bmod \{Ge(X)\}\} \qquad (1)$$

Here, $$I(X) = \sum_{j=0}^{3} Cj \cdot X^{3-j}, \qquad (2)$$

$$Ge(X) = \prod_{k=0}^{t} (X + \alpha^k), \qquad (3)$$

and α is a root of a primitive polynomial, $$P(x)=x^8+x^4+x^3+x^2+1 \qquad (4).$$

α corresponds to the element of the Galois field, and has characteristics as shown in FIG. 5 and FIG. 6 when vector representation is used.

The above equation is solved by using FIG. 5 and FIG. 6, providing the result as follows.

$$C_4=\alpha^{25} \cdot C_3+\alpha^{198} \cdot C_2+\alpha^{75} \cdot C_1+\alpha^{113} \cdot C_0 \qquad (5)$$

$$C_5=\alpha^1 \cdot C_3+\alpha^{26} \cdot C_2+\alpha^{199} \cdot C_1+\alpha^{76} \cdot C_0 \qquad (6)$$

The IED according to the embodiment of the invention realizes the above solution by use of a logic circuit as follows based on the vector representation of FIG. 5.

IED[15:8]=mulgf(8'h03, C3)^mulgf(8'h07, C2)^mulgf(8'h0f, C1)^mulgf(8'h1f, C0);

IED[7:0]=mulgf(8'h02, C3)^mulgf(8'h06, C2)^mulgf(8'h0e, C1)^mulgf(8'h1e, C0);

Here, mulgf is a multiplier of Galois fields, and is implemented by a logic circuit as shown in FIG. 7 with inputs denoted as AI [7:0] and BI [7:0] and an output denoted as mulgf [7:0]. Here, the logic circuit completes its logic operation with only a device delay, which is associated with signal propagation through devices.

It should be noted that "^" in these logic expression represents an EXOR gate and "&" represents an AND gate.

In what follows, the EDC according to the invention will be described. With the MSB of the first byte of the ID denoted as b16511 and the LSB of the last byte of the EDC denoted as b0, the EDC operation is defined as follows.

$$EDC(X) = \sum_{i=31}^{0} b_i \cdot X^i = I(X) \bmod\{g(X)\} \quad (7)$$

Here, I(X) and g(X) are as follows.

$$I(X) = \sum_{i=16511}^{32} b_i \cdot X^i \quad (8)$$

$$g(X)=X^{32}+X^{31}+X^4+1 \quad (9)$$

Figure 8:
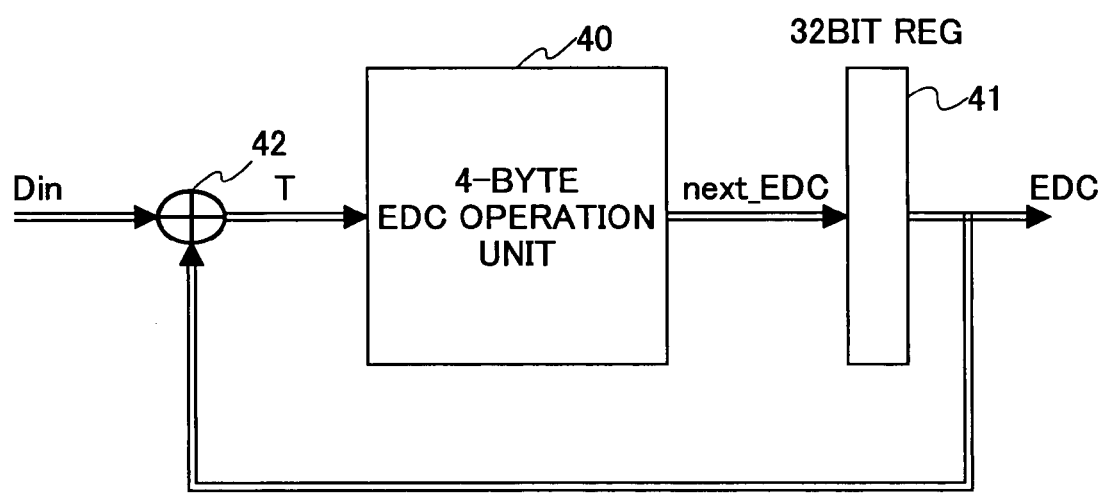
FIG. 8 is a block diagram showing the construction of an EDC.

The EDC according to the embodiment of the invention successively receives 4-byte data, and generates an error detection code upon the inputting of data for one sector. FIG. 8 is a block diagram showing the construction of the EDC.

In FIG. 8, Din is the 4-byte data that is successively received. T is obtained by an EXOR gate 42 that performs an EXOR operation between an output EDC of a 32-bit register 41 and Din.

A 4-byte EDC operation unit 40 shown in FIG. 8 is a logic circuit that converts the above formula into another formula for 4-byte-by-4-byte computation. Such a unit is implemented by use of FIG. 9. Here, the logic circuit completes its logic operation with only a device delay, which is associated with signal propagation through devices.

In the following, the scrambling circuit of the invention will be described. Data D'k after scrambling is obtained by performing an EXOR (exclusive logical sum) operation between original Data Dk and scrambling data Sk.

$$D'_k = D_k \oplus S_k \quad (10)$$

(k=0-2047)

Figure 10:
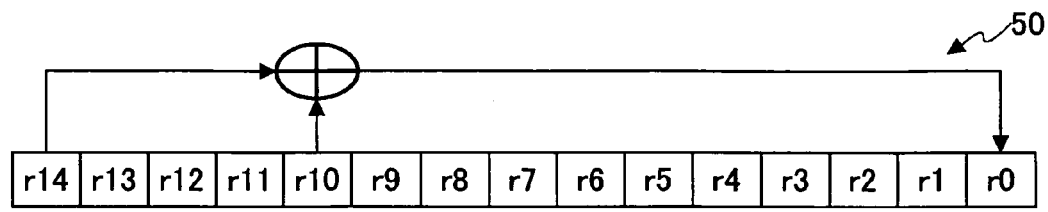
FIG. 10 is a diagram showing the construction of a feedback register.

Sk is defined as bits r7-r0 of a feedback shift register 50 as shown in FIG. 10.

The initial value of the feedback shift register 50 is determined based on a sector ID.

The scrambling circuit according to the embodiment of the invention successively receives 4-byte data, and successively outputs scrambled data. It follows that a logic circuit for updating slice data for every 4 bytes is necessary. Such a circuit is shown in FIG. 11.

Figure 11:
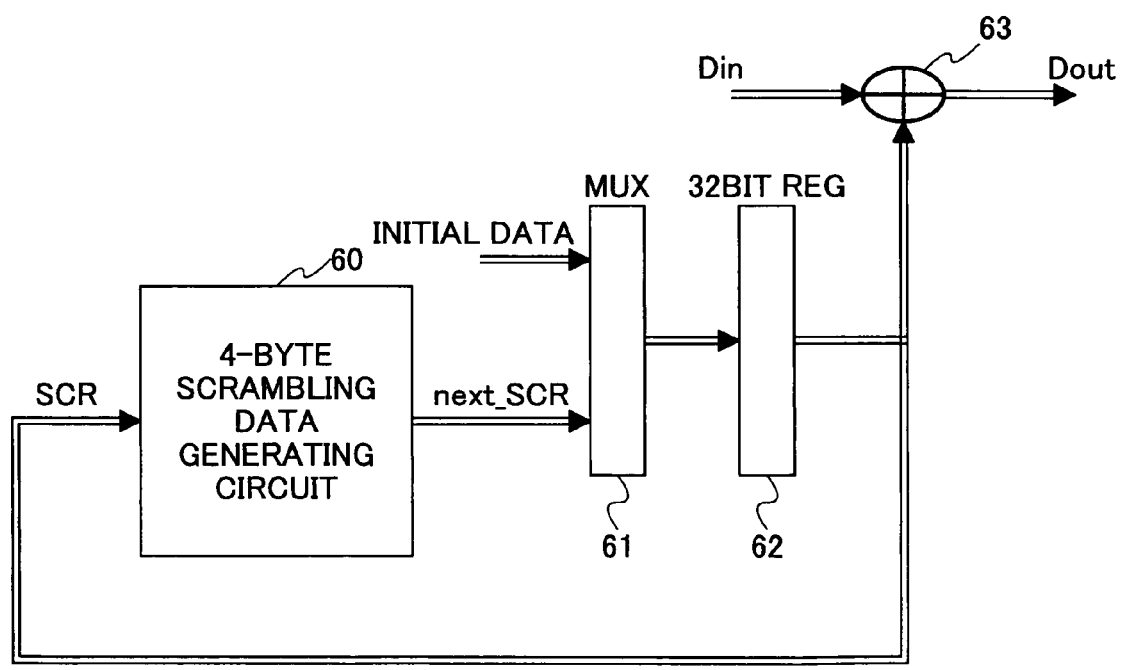
FIG. 11 is a block diagram showing the construction of a scrambling circuit.

The circuit of FIG. 11 includes a 4-byte scrambling data generating circuit 60, a multiplexer 61, a 32-bit register 62, and an EXOR gate 63. The multiplexer 61 selects one of the initial data and the output of the 4-byte scrambling data generating circuit 60 for storage in the 32-bit register 62. The output of the 32-bit register 62 is supplied as an input to the 4-byte scrambling data generating circuit 60, and is also supplied to the EXOR gate 63, which performs an EXOR operation between Din and the output of the 32-bit register 62.

The 4-byte scrambling data generating circuit 60 of FIG. 11 is implemented by FIG. 12. Here, such a logic circuit completes its logic operation with only a device delay, which is associated with signal propagation through devices.

In the following, the PI parity unit of the invention will be described. With the 172 bytes of the input denoted as B0, B1, B2, . . . B171 and the 10 bytes of the output denoted as B172-B181, the PI parity operation is defined as follows.

$$PI(X) = \sum_{j=172}^{181} B_j \cdot X^{180-j} = \{(I(X) \cdot X^{10}) \bmod\{Gpi(X)\}\} \quad (11)$$

Here, $$I(X) = \sum_{j=0}^{171} B_j \cdot X^{171-j}, \quad (12)$$

$$Gpi(X) = \prod_{k=0}^{9} (X + \alpha^k), \quad (13)$$

and α is a root of a primitive polynomial, $$P(x)=x^8+x^4+x^3+x^2+1 \quad (14).$$

α corresponds to the element of the Galois field, and has characteristics as shown in FIG. 5 and FIG. 6 when vector representation is used, as in the case of the IED operation.

The PI parity unit according to the embodiment of the invention successively receives 4-byte data, and generates a 10-byte PI parity code upon the inputting of 172 bytes. Such a unit has a construction as shown in FIG. 13.

Figure 13:
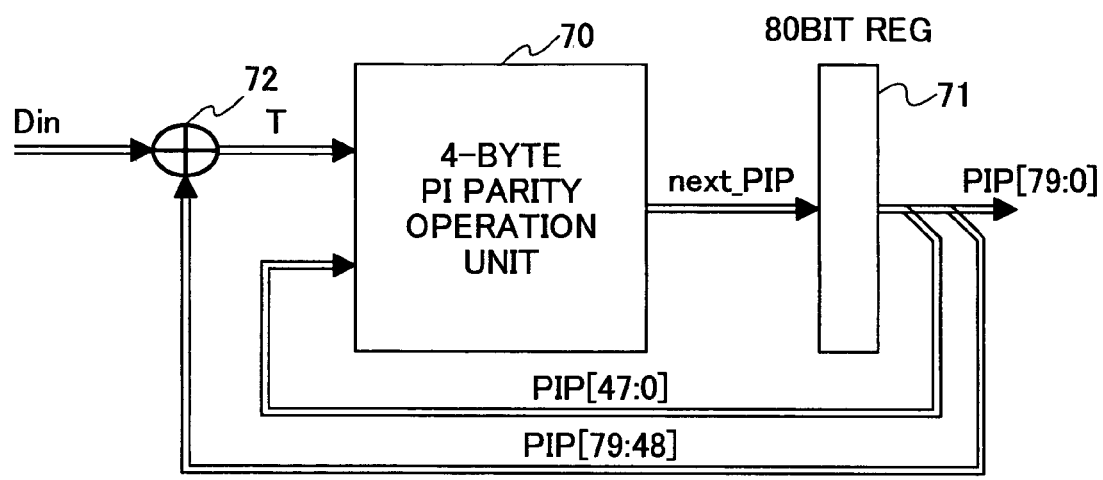
FIG. 13 is a block diagram showing the construction of a PI parity unit.

In FIG. 13, Din is the 4-byte data that is successively received. T is obtained by an EXOR gate 72 that performs an EXOR operation between a portion PIP[79:48] of the output PIP[79:0] of a 80-bit register 71 and Din.

A 4-byte PI parity operation unit 70 shown in FIG. 13 is implemented by a logic circuit as shown in FIG. 14, which is obtained by solving the above equation by use of FIG. 5 and FIG. 6. Here, the logic circuit completes its logic operation with only a device delay, which is associated with signal propagation through devices.

In the following, the PO parity unit of the invention will be described. With the 192 bytes of the input denoted as B0, B1, B2, . . . , and B191 and the 16 bytes of the output denoted as B172-B181, the PO parity operation is defined as follows.

$$PO(X) = \sum_{i=192}^{207} B_i \cdot X^{207-i} = \{(I(X) \cdot X^{16}) \bmod\{Gpo(X)\}\} \quad (15)$$

Here, $$I(X) = \sum_{i=0}^{191} Bi \cdot X^{191-i}, \quad (16)$$

$$Gpo(X) = \prod_{k=0}^{15} (X + \alpha^k), \quad (17)$$

and α is a root of a primitive polynomial, $$P(x) = x^8 + x^4 + x^3 + x^2 + 1 \quad (18).$$

α corresponds to the element of the Galois field, and has characteristics as shown in FIG. 5 and FIG. 6 when vector representation is used, as in the case of the IED operation.

The PO parity unit according to the embodiment of the invention is comprised of four operation units arranged in parallel, each of which successively receives 1-byte data, and generates a 16-byte PO parity code upon the inputting of 192 bytes. The PO parity unit has a construction as shown in FIG. 15.

Figure 15:
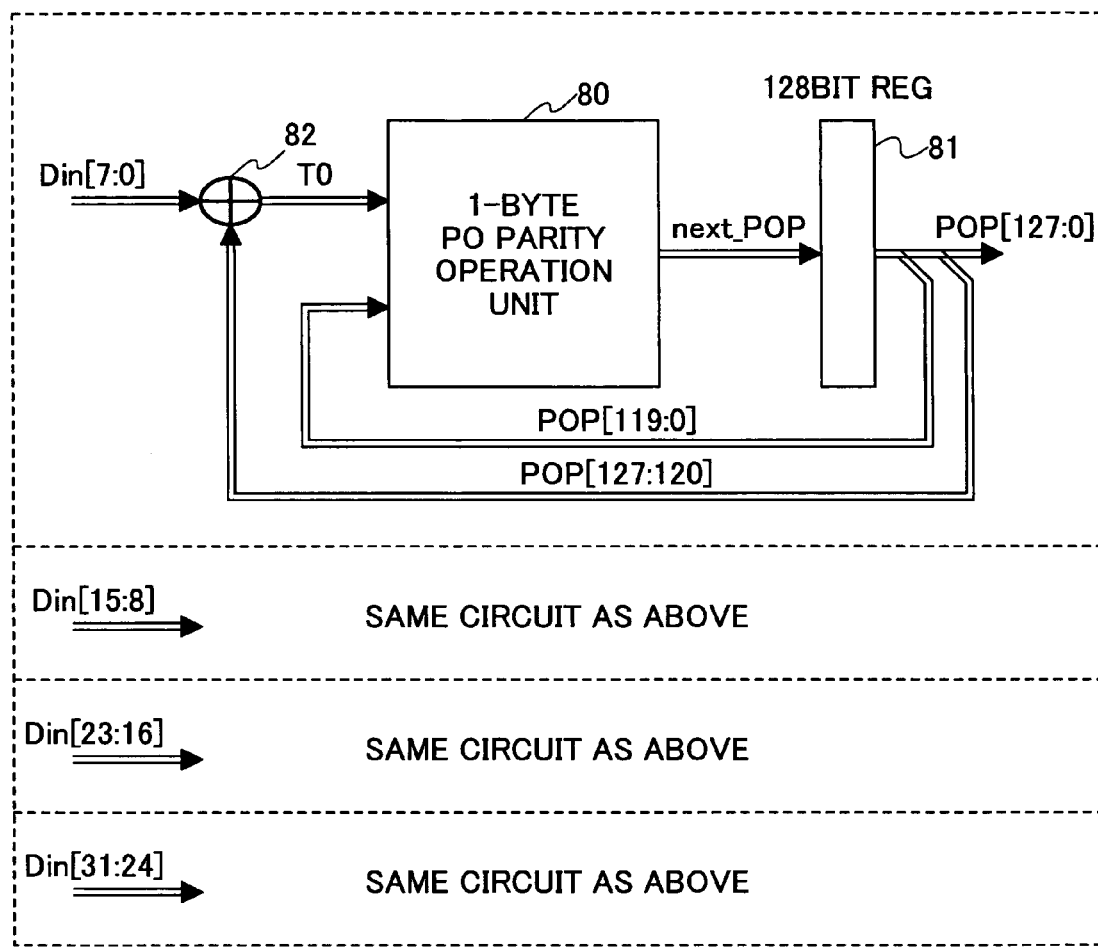
FIG. 15 is a block diagram showing the construction of a PO parity unit.

In FIG. 15, four operation units are provided in parallel with respect to four respective input portions Din[7:0], Din [15:8], Din[23:16], and Din[31:24]. Din[7:0], for example, is the 1-byte data (8-bit data) that is successively received. T0 is obtained by an EXOR gate 82 that performs an EXOR operation between a portion POP[127:120] of the output POP[127: 0] of a 128-bit register 81 and Din[7:0].

A 1-byte PO parity operation unit 80 shown in FIG. 15 is implemented by a logic circuit as shown in FIG. 16, which is obtained by solving the above equation by use of FIG. 5 and FIG. 6. Here, the logic circuit completes its logic operation with only a device delay, which is associated with signal propagation through devices.

Figure 17:
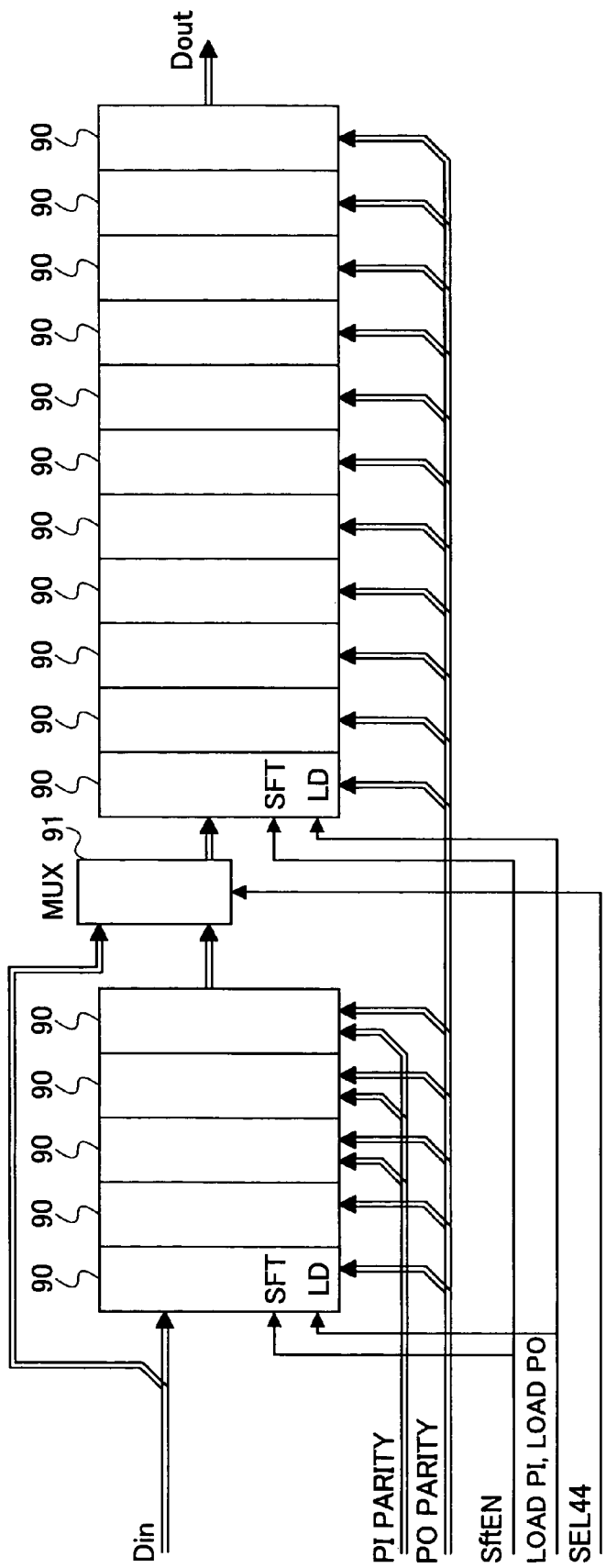
FIG. 17 is a circuit diagram showing an example of the construction of a FIFO.

In the following, the FIFO of the invention will be described. FIG. 17 is a circuit diagram showing an example of the construction of the FIFO according to the embodiment of the invention.

The FIFO is a shift register including 16 stages, each of which is a 4-byte (32-bit) register 90 capable of parallel inputting. A selector (MUX) 91 is provided between the fifth stage and the sixth stage, and switches in response to a signal SEL44.

In the following, the operation of the FIFO will be described with respect to a case in which a PI sequence operation is performed. The PI sequence operation attaches a 10-byte PI parity to 172-byte data for one row. This operation is performed through three separate steps such as 64 bytes+ 64bytes+(44bytes+10-byte PI parity) In the embodiment of the invention, data is input 4 bytes at a time, and the operation comes to an end as the number of input data reaches a predetermined number. When 64 (4×16) bytes are read from the temporal storage memory, the data of FIFO is written in the temporal storage memory 4 bytes at a time. The same applies in the case of next 64 (4×16) bytes. At the end, the signal SEL44 is asserted, thereby providing for data to be input directly into the sixth stage of the FIFO. With this provision, 44 (4×11) bytes of data are read from the temporal storage memory. When the reading is completed, the PI parity operation also comes to an end. The 10 bytes of the PI parity are then loaded to half the third stage, the fourth stage, and the fifth stage. There are a total of 54 bytes of data in the FIFO, and these data are written in the temporal storage memory 4 bytes at a time. This results in the two last bytes being left out. These data can be disregarded.

In what follows, the operation of the FIFO will be described with respect to a case in which a PO sequence operation is performed. The PO sequence operation attaches a 16-byte PO parity to 192-byte data for one column. In the embodiment of the invention, the PO sequence operation is simultaneously performed with respect to four columns. When 64 (4×16) bytes are read forty-eight times from the temporal storage memory, the computation of the PO parity is completed for 64 bytes for a total of four columns. Loading to the FIFO is then performed, and writing in the temporal storage memory is carried out 4 bytes at a time. As shown in FIG. 2, one ECC block is comprised of 182 columns, the PO sequence operation results in the two last columns being left out. The computation of these two columns can be disregarded.

Figure 18:
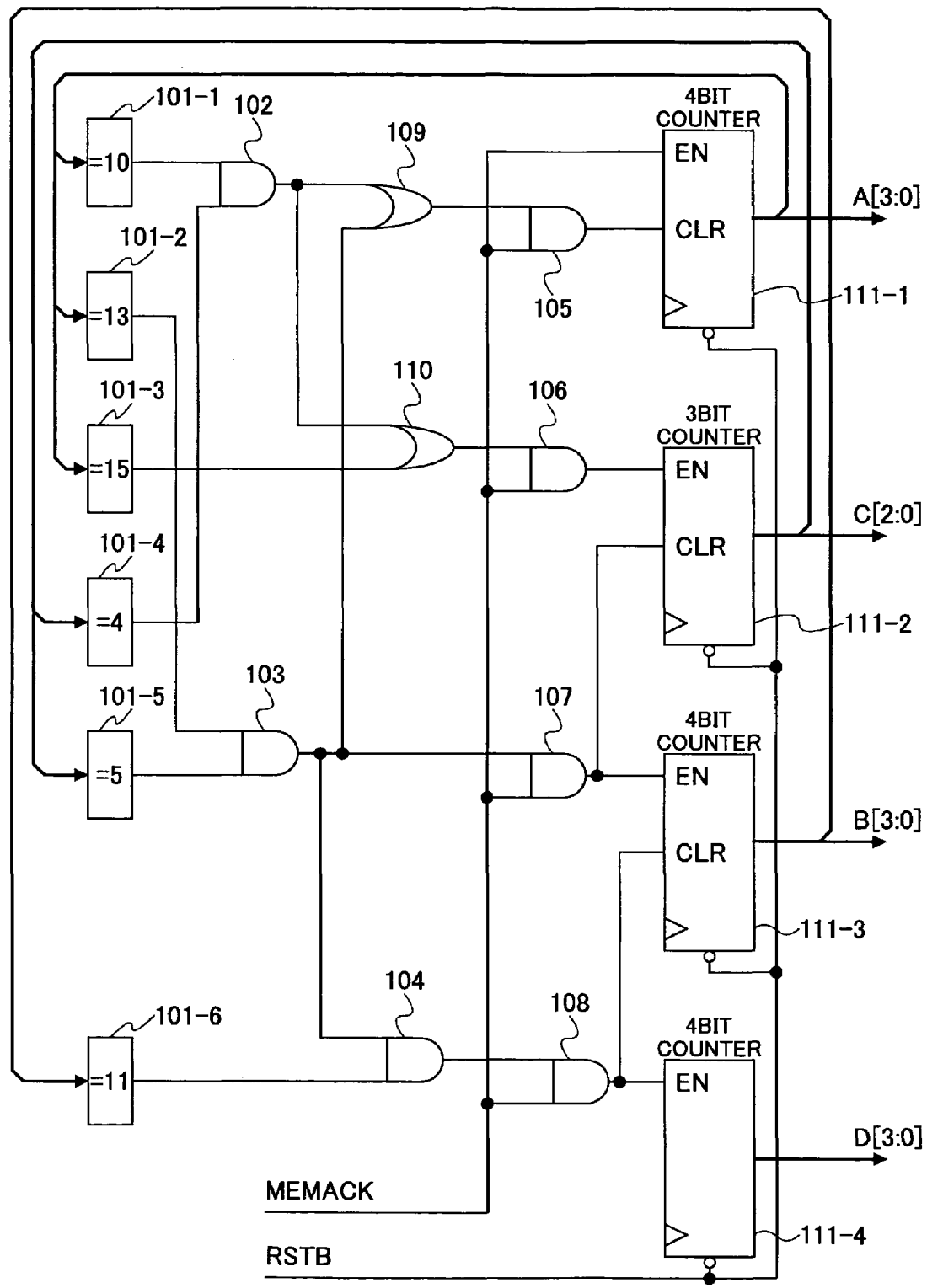
FIG. 18 is a circuit diagram showing the construction of an address generating circuit that supplies address signals to a temporal storage memory during a PI sequence operation.

In the following, a description will be given of the control circuit of the invention. FIG. 18 is a circuit diagram showing the construction of an address generating circuit that supplies address signals to the temporal storage memory during the PI sequence operation according to the embodiment of the invention.

The address generating circuit of FIG. 18 includes decoders 101-1 through 101-6, AND gates 102 through 108, OR gates 109 and 110, a 4-bit counter 111-1, a 3-bit counter 111-2, and 4-bit counters 111-3 and 111-4. Each of the counters 111-1 through 111-4 of FIG. 18 performs a counting-up operation when EN is 1, and clears the count when CLR is 1.

The decoder 101-1 outputs "1" when the output A[3:0] of the counter 111-1 is "10". The decoder 101-2 outputs "1" when the output A[3:0] is "13". The decoder 101-3 outputs "1" when the output A[3:0] is "15". The decoder 101-4 outputs "1"when the output C[2:0] of the counter 111-2 is "4". The decoder 101-5 outputs "1" when the output C[2:0] is "5". The decoder 101-6 outputs "1" when the output B[3:0] of the counter 111-3 is "11".

The address supplied to the temporal storage memory is provided as {D [3:0], C [2:1], B [3:0], A [3:0]} which are outputs of the counters.

The counter output C[0] is used as a read/write signal ("0" for read and "1" for write) that is supplied to the temporal storage memory.

Moreover, the selection signals supplied to the multiplexers shown in FIG. 4 and the control signals such as start/stop signals for the arithmetic operation units may also be generated by decoding the outputs of the counters 111-1 through 111-4. For example, the multiplexers are controlled such that the ID data is input into the FIFO when {C [2:1], B [3:0], A [3:0] } is 0. The IED corresponds to a case in which {C [2:1], B [3:0], A [3:0]} is 1. Other selections are made in a similar manner, and a description thereof will be omitted.

Figure 19:
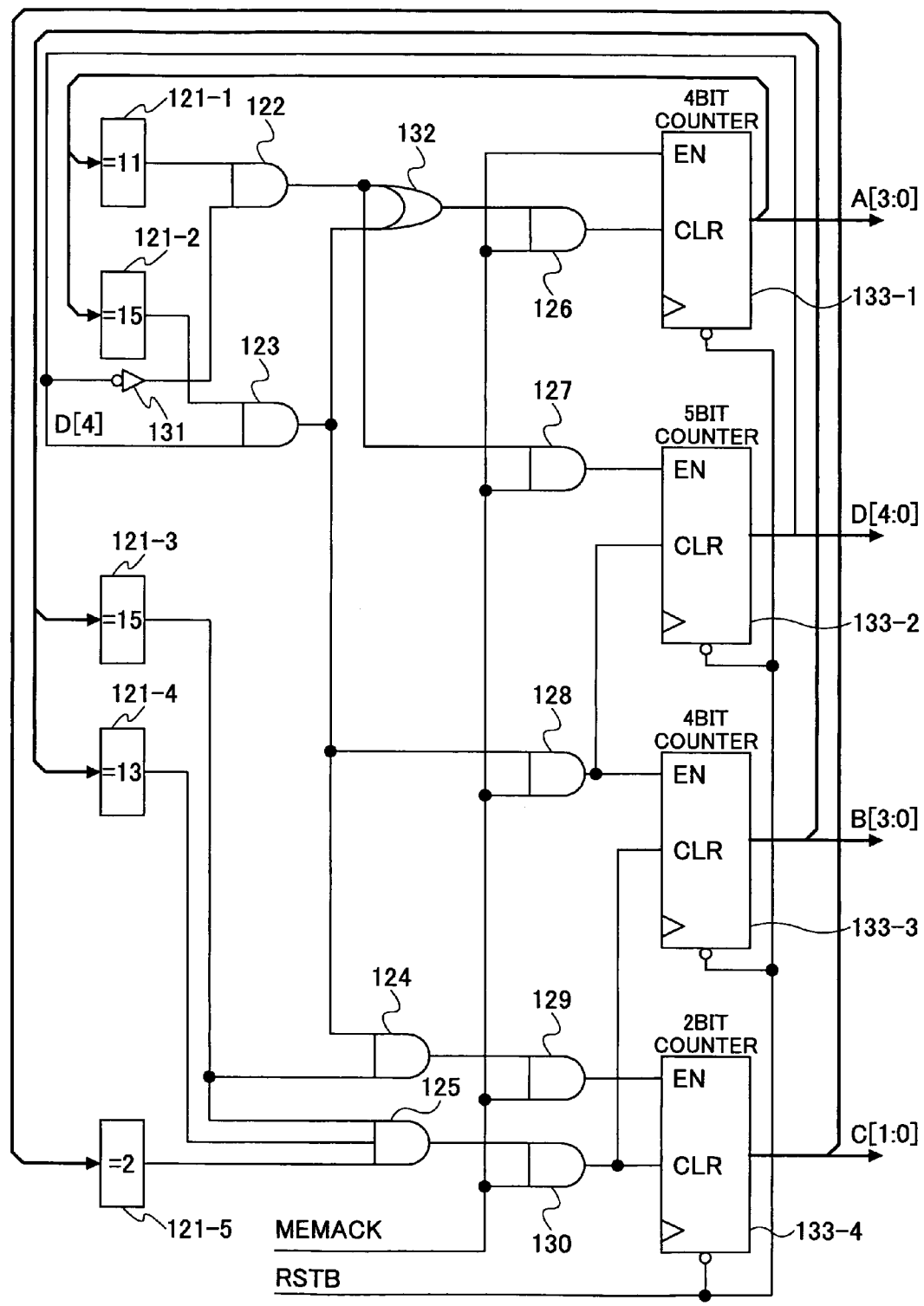
FIG. 19 is a circuit diagram showing the construction of an address generating circuit that supplies address signals to the temporal storage memory during a PO sequence operation.
Figure 23:
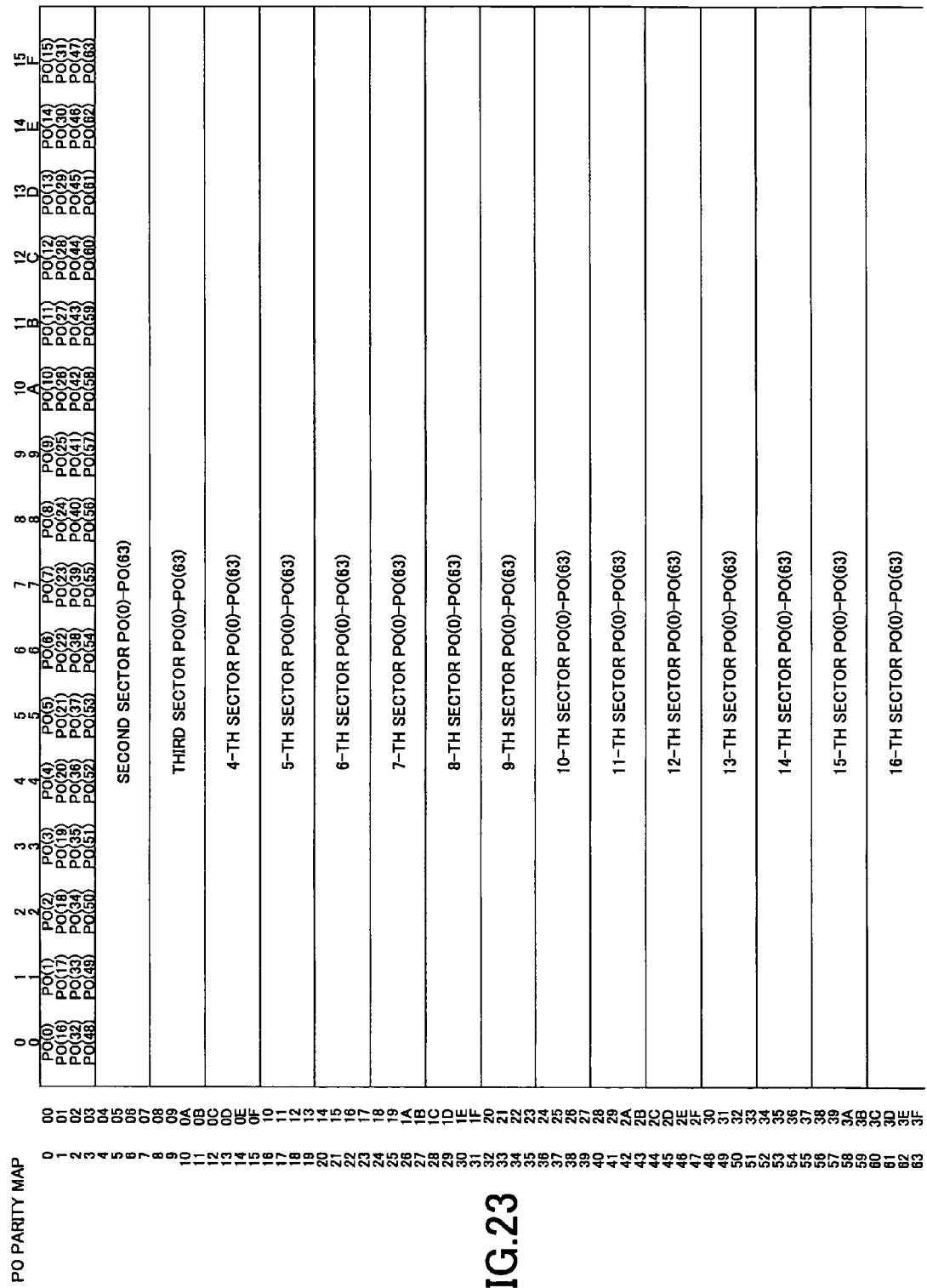
FIG. 23 is a diagram showing part of a data sector in the temporal storage memory.

FIG. 19 is a circuit diagram showing the construction of an address generating circuit that supplies address signals to the temporal storage memory during the PO sequence operation according to the embodiment of the invention.

The address generating circuit of FIG. 19 includes decoders 121-1 through 121-5, AND gates 122 through 130, an inverter 131, an OR gate 132, a 4-bit counter 133-1, a 5-bit counter 133-2, a 4-bit counter 133-3, and a 2-bit counter 133-4. Each of the counters 133-1 through 133-4 of FIG. 19 performs a counting-up operation when EN is 1, and clears the count when CLR is 1.

The decoder 121-1 outputs "1" when the output A[3:0] of the counter 133-1 is "11". The decoder 121-2 outputs "1"

when the output A[3:0] is "15". The decoder 121-3 outputs "1" when the output B[3:0] of the counter 133-3 is "15". The decoder 121-4 outputs "1" when the output B[3:0] is "13". The decoder 121-5 outputs "1" when the output C[1:0] of the counter 133-4 is "2".

The address supplied to the temporal storage memory is provided as {D [4:0], C [1:0], A [3:0], B [3:0]} which are outputs of the counters.

The counter output D[4] is used as a read/write signal ("0" for read and "1" for write) that is supplied to the temporal storage memory.

By the operation of the address generating circuits of FIG. 18 and FIG. 19, the sector data of FIG. 1 (including PI and PO) is laid out in the temporal storage memory as shown in FIG. 20, FIG. 21, FIG. 22, FIG. 23, FIG. 24, and FIG. 25.

Further, the present invention is not limited to these embodiments, but various variations and modifications may be made without departing from the scope of the present invention.

The present application is based on Japanese priority application No. 2002-374903 filed on Dec. 25, 2002, with the Japanese Patent Office, the entire contents of which are hereby incorporated by reference.

What is claimed is:

1. A coding circuit for coding digital data that is to be recorded in a record medium, comprising:
    a temporal storage memory which stores original data to be recorded, intermediate processing results, and final processing results;
    an identification data (ID) error detection unit which processes all m bytes of an ID at a time to generate an n-byte ID error detection code, wherein m is four, and n is two;
    an error detection code (EDC) unit which processes the original data m bytes at a time to generate a data error detection code;
    a scrambling unit which scrambles the original data m bytes at a time;
    a first parity unit which processes the ID, the ID error detection code, the data error detection code, and the scrambled original data m bytes at a time to generate an inner code (PI) parity; and
    a second parity unit which includes m operation units, each of which processes the intermediate processing results one byte at a time to generate an outer code (PO) parity,
    wherein the original data is read from the temporal storage memory in a main scan direction for attaching of the ID, for attaching of the ID error detection code, for attaching of the data error detection code, far scrambling, and for attaching of the PI parity, followed by storage in the temporal storage memory as the intermediate processing results, until an end of an error correction (ECC) block is encountered,
    and wherein the intermediate processing results are read from the temporal storage memory in a sub-can direction for attaching of the PO parity, followed by storage in the temporal storage memory as the final processing results, until the end of the ECC block is encountered,
    a first counter which is capable of switching between counting from 0 to 15, counting from 0 to 10, counting from 0 to 13;
    a second counter which counts from 0 to 5, and counts up in response to a carry from said first counter;
    a third counter which counts from 0 to 11, and counts up in response to a carry from said second counter;
    a fourth counter which counts from 0 to 15, and counts up in response to a carry from said third counter, wherein all output bits of said fourth counter, bit2 and bit1 of output bits of said second counter, all output bits of said third counter, and all output bits of said first counter are arranged in an order named for use as an address for said temporal storage memory, and bit0 of output bits of said second counter is used to indicate either "write" or "read" when data is read from and written in said temporal storage memory in the main scan direction;
    a fifth counter which is capable of switching between counting from 0 to 15 and counting from 0 to 11;
    a sixth counter which counts from 0 to 16, and counts up in response to a carry from said fifth counter;
    a seventh counter which is capable of switching between counting from 0 to 15 and counting from 0 to 13, and counts up in response to a carry from said sixth counter; and
    an eighth counter which counts from 0 to 2, and counts up in response to a carry from said seventh counter, wherein all output bits of said sixth counter, all output bits of said eighth counter, all output bits of said fifth counter, and all output bits of said seventh counter are arranged in an order named for use as an address for said temporal storage memory, and bit4 of output bits of said sixth counter is used to indicate either "write" or "read" when data is read from and written in said temporal storage memory in the sub-scan direction.

2. An encoding data processor for generating product codes for parity check as error correction codes and adding the product codes to digital data that is to be recorded in a record medium, comprising:
    a memory which stores original data, intermediate encoding result data, and final encoding result data;
    a buffer manager which accesses the memory to read or write the original data, the intermediate encoding result data, and the final encoding result data in predetermined sequences; and
    a code generating block,
    wherein the predetermined sequences are such that
        in a case of reading the original data, the original data is read in a main scan direction in units of m consecutive bytes (m: integer that is greater than 1), and the reading of the original data continues until an end of a block of the original data is reached,
        in a case of storing the intermediate encoding result data, the intermediate encoding result data is stored to replace the original data in the main scan direction in units of m consecutive bytes, the storing of the intermediate encoding result data moves to a next row in the sub-scan direction upon reaching an end of the original data extending in the main scan direction, with writing of main-scan-direction parity code before the moving to the next row, and the storing of the intermediate encoding result data continues until reaching an end of a block of the intermediate, encoding result data,
        in a case of reading the intermediate encoding result data, the intermediate encoding result data is read in the sub-scan direction in units of m consecutive bytes, the reading of the intermediate encoding result data moves in columns forward in the main-scan direction upon reaching an end of the intermediate encoding result data extending in the sub-scan direction, and the reading of the intermediate encoding result data continues until reaching an end of a block of the intermediate encoding result data, and
        in a case of storing the final encoding result data, sub-scan-direction parity codes are stored in the sub-scan direction in units of m consecutive bytes, the storing of the sub-scan-direction parity codes moves in columns forward in the main-scan direction upon reaching an end of the sub-scan-direction parity codes for current columns, and the storing of the sub-scan-direction parity codes continues until reaching an end of an entirety of the sub-scan-direction parity codes, wherein the code generating block includes:
- a first unit configured to generate header information data to be attached to each recorded sector;
- a first selector unit configured to select the header information data and the original data read by the buffer manager in the main scan direction in units of m bytes and to output data of m-byte width;
- a second unit configured to process the data output from the first selector unit in units of m bytes to generate error detection codes;
- a third unit configured to convert the data output from the first selector unit into scrambled data through conversion performed for m bytes at a time;
- a second selector unit configured to select the data output from the first selector unit, the error detection codes, and the scramble data to output data of an m-byte width;
- a fourth unit configured to process the data output from the second selector unit in units of m bytes to generate the main-scan-direction parity codes, wherein the data output from the second selector unit and the main-scan-direction parity code are written by the buffer manager as the intermediate encoding result data in the main-scan direction in units of m consecutive bytes; and
- m units each configured to process, in units of one byte, the intermediate encoding result data read as data of an m-byte width in the sub-scan direction by the buffer manager so as to generate the sub-scan-direction parity codes, wherein the generated sub-scan-direction parity codes are written by the buffer manager in the sub-scan direction in units of m consecutive bytes.

3. The encoding data processor of claim 2, wherein m is two or greater.

4. An encoding data processor for generating product codes for parity check as error correction codes and adding the product codes to digital data that is to be recorded in a record medium complying with a DVD standard, comprising:
- an external memory which stores original data, intermediate encoding results data, and final encoding results data;
- a buffer manager which accesses the external memory to read or write the original data, the intermediate encoding result data, and the final encoding result data in predetermined sequences;
- a code generating block, wherein the predetermined sequences are such that
in a case of reading the original data, the original data is read in a PI sequence in units of 4 consecutive bytes, the reading of the original data moves to a next row in a PO sequence upon reaching an end of the PI sequence, and the reading of the original data continues until reaching an end of block data, in a case of storing the intermediate encoding result data, the intermediate encoding result data is stored to replace the original data in the PI sequence in units of 4 consecutive bytes, the storing of the intermediate encoding result data moves to a next row in the PO sequence upon reaching an end of the PI sequence, with writing of PI parity code before the moving to the next row, and the storing of the intermediate encoding result data continues until reaching the end of the block data, in a case of reading the intermediate encoding result data, the intermediate encoding result data is read in the PO sequence in units of 4 consecutive bytes, the reading of the intermediate encoding result data moves 4 columns forward in the PI sequence upon reaching on end of the PO sequence, and the reading of the intermediate encoding result data continues until reaching the end of the block data, and in a case of storing the final encoding result data, PO parity codes are stored in the PO sequence in units of 4 consecutive bytes, the storing of the PO parity codes moves 4 columns forward in the PI sequence upon reaching a current end of the PO parity codes, and the storing of the PO parity codes continues until reaching an end of the PO parity codes, wherein the code generating block includes:
- a first unit configured to generate information data to be attached to each recorded sector;
- a first selector unit configured to select the information data and the original data read by the buffer manager in the main scan direction in units of 4 bytes and to output data of a 4-byte width;
- a second unit configured to receive the data output from the first selector unit to process the data of the 4-byte width at a time to generate an error detection code;
- third unit configured to scramble the data output from the first selector unit 4 bytes at a time to generate scrambled data;
- a second selector unit configured to select the data output from the first selector unit, the error detection codes, and the scrambled data to output data of 4-byte width;
- a fourth unit configured to process the data output from the second selector unit in units of 4 bytes to generate the PI codes, wherein the data output from the second selector unit and the PI parity code are written by the buffer manager as the intermediate encoding result data in the PI sequence in units of 4 consecutive bytes; and
- 4 units each configured to process, in units of one byte, the intermediate encoding result data read as data of 4-byte width in the PO sequence by the buffer manager so as to generate the PO parity codes, wherein the generated PO parity codes are written by the buffer manager in the PO sequence in units of 4 consecutive bytes.

* * * * *